(12) United States Patent
Willcock et al.

(10) Patent No.: US 10,014,034 B2
(45) Date of Patent: Jul. 3, 2018

(54) SHIFTING DATA IN SENSING CIRCUITRY

(71) Applicant: Micron Technology, Inc., Boise, ID (US)

(72) Inventors: Jeremiah J. Willcock, Boise, ID (US); Glen E. Hush, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/286,836

(22) Filed: Oct. 6, 2016

(65) Prior Publication Data

US 2018/0102147 A1    Apr. 12, 2018

(51) Int. Cl.
*G11C 7/02* (2006.01)
*G11C 7/06* (2006.01)

(52) U.S. Cl.
CPC .................... *G11C 7/065* (2013.01)

(58) Field of Classification Search
CPC ..................................... G11C 7/065
USPC ................................. 365/205, 207
See application file for complete search history.

(56) References Cited

U.S. PATENT DOCUMENTS

| | | |
|---|---|---|
| 4,380,046 A | 4/1983 | Fung |
| 4,435,792 A | 3/1984 | Bechtolsheim |
| 4,435,793 A | 3/1984 | Ochii |
| 4,727,474 A | 2/1988 | Batcher |
| 4,843,264 A | 6/1989 | Galbraith |
| 4,958,378 A | 9/1990 | Bell |
| 4,977,542 A | 12/1990 | Matsuda et al. |
| 5,023,838 A | 6/1991 | Herbert |
| 5,034,636 A | 7/1991 | Reis et al. |
| 5,201,039 A | 4/1993 | Sakamura |
| 5,210,850 A | 5/1993 | Kelly et al. |
| 5,253,308 A | 10/1993 | Johnson |
| 5,276,643 A | 1/1994 | Hoffman et al. |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Viet Q Nguyen
(74) *Attorney, Agent, or Firm* — Brooks, Cameron & Huebsch, PLLC

(57) ABSTRACT

The present disclosure is related to shifting data using sensing circuitry. An example apparatus can include a first sensing component and a second sensing component. The first sensing component can include a first sense amplifier coupled to a first pair of complementary sense lines and a first compute component comprising a number of first pass transistors. The second sensing component can include a second sense amplifier coupled to a second pair of complementary sense lines. The second sensing component can include a second compute component comprising a number of second pass transistors. The first pair of complementary sense lines can be coupled to the number of first pass transistors and the number of second pass transistors.

26 Claims, 6 Drawing Sheets

(56) References Cited

U.S. PATENT DOCUMENTS

| | | |
|---|---|---|
| 5,325,519 A | 6/1994 | Long et al. |
| 5,367,488 A | 11/1994 | An |
| 5,379,257 A | 1/1995 | Matsumura et al. |
| 5,386,379 A | 1/1995 | Ali-Yahia et al. |
| 5,398,213 A | 3/1995 | Yeon et al. |
| 5,440,482 A | 8/1995 | Davis |
| 5,446,690 A | 8/1995 | Tanaka et al. |
| 5,473,576 A | 12/1995 | Matsui |
| 5,481,500 A | 1/1996 | Reohr et al. |
| 5,485,373 A | 1/1996 | Davis et al. |
| 5,506,811 A | 4/1996 | McLaury |
| 5,615,404 A | 3/1997 | Knoll et al. |
| 5,638,128 A | 6/1997 | Hoogenboom |
| 5,638,317 A | 6/1997 | Tran |
| 5,654,936 A | 8/1997 | Cho |
| 5,678,021 A | 10/1997 | Pawate et al. |
| 5,724,291 A | 3/1998 | Matano |
| 5,724,366 A | 3/1998 | Furutani |
| 5,751,987 A | 5/1998 | Mahant-Shetti et al. |
| 5,787,458 A | 7/1998 | Miwa |
| 5,854,636 A | 12/1998 | Watanabe et al. |
| 5,867,429 A | 2/1999 | Chen et al. |
| 5,870,504 A | 2/1999 | Nemoto et al. |
| 5,915,084 A | 6/1999 | Wendell |
| 5,935,263 A | 8/1999 | Keeth et al. |
| 5,986,942 A | 11/1999 | Sugibayashi |
| 5,991,209 A | 11/1999 | Chow |
| 5,991,785 A | 11/1999 | Alidina et al. |
| 6,005,799 A | 12/1999 | Rao |
| 6,009,020 A | 12/1999 | Nagata |
| 6,091,625 A * | 7/2000 | Braun .................... G11C 11/22 365/145 |
| 6,092,186 A | 7/2000 | Betker et al. |
| 6,122,211 A | 9/2000 | Morgan et al. |
| 6,125,071 A | 9/2000 | Kohno et al. |
| 6,134,164 A | 10/2000 | Lattimore et al. |
| 6,147,514 A | 11/2000 | Shiratake |
| 6,151,244 A | 11/2000 | Fujino et al. |
| 6,157,578 A | 12/2000 | Brady |
| 6,163,862 A | 12/2000 | Adams et al. |
| 6,166,942 A | 12/2000 | Vo et al. |
| 6,172,918 B1 | 1/2001 | Hidaka |
| 6,175,514 B1 | 1/2001 | Henderson |
| 6,181,698 B1 | 1/2001 | Hariguchi |
| 6,208,544 B1 | 3/2001 | Beadle et al. |
| 6,226,215 B1 | 5/2001 | Yoon |
| 6,301,153 B1 | 10/2001 | Takeuchi et al. |
| 6,301,164 B1 | 10/2001 | Manning et al. |
| 6,304,477 B1 | 10/2001 | Naji |
| 6,389,507 B1 | 5/2002 | Sherman |
| 6,418,498 B1 | 7/2002 | Martwick |
| 6,466,499 B1 | 10/2002 | Blodgett |
| 6,510,098 B1 | 1/2003 | Taylor |
| 6,563,754 B1 | 5/2003 | Lien et al. |
| 6,578,058 B1 | 6/2003 | Nygaard |
| 6,731,542 B1 | 5/2004 | Le et al. |
| 6,754,746 B1 | 6/2004 | Leung et al. |
| 6,768,679 B1 | 7/2004 | Le et al. |
| 6,807,614 B2 | 10/2004 | Chung |
| 6,816,422 B2 | 11/2004 | Hamade et al. |
| 6,819,612 B1 | 11/2004 | Achter |
| 6,894,549 B2 | 5/2005 | Eliason |
| 6,943,579 B1 | 9/2005 | Hazanchuk et al. |
| 6,948,056 B1 | 9/2005 | Roth |
| 6,950,771 B1 | 9/2005 | Fan et al. |
| 6,950,898 B2 | 9/2005 | Merritt et al. |
| 6,956,770 B2 | 10/2005 | Khalid et al. |
| 6,961,272 B2 | 11/2005 | Schreck |
| 6,965,648 B1 | 11/2005 | Smith et al. |
| 6,985,394 B2 | 1/2006 | Kim |
| 6,987,693 B2 | 1/2006 | Cernea et al. |
| 7,020,017 B2 | 3/2006 | Chen et al. |
| 7,028,170 B2 | 4/2006 | Saulsbury |
| 7,045,834 B2 | 5/2006 | Tran et al. |
| 7,054,178 B1 | 5/2006 | Shiah et al. |
| 7,061,817 B2 | 6/2006 | Raad et al. |
| 7,079,407 B1 | 7/2006 | Dimitrelis |
| 7,173,857 B2 | 2/2007 | Kato et al. |
| 7,187,585 B2 | 3/2007 | Li et al. |
| 7,196,928 B2 | 3/2007 | Chen |
| 7,260,565 B2 | 8/2007 | Lee et al. |
| 7,260,672 B2 | 8/2007 | Garney |
| 7,372,715 B2 | 5/2008 | Han |
| 7,400,532 B2 | 7/2008 | Aritome |
| 7,406,494 B2 | 7/2008 | Magee |
| 7,447,720 B2 | 11/2008 | Beaumont |
| 7,454,451 B2 | 11/2008 | Beaumont |
| 7,457,181 B2 | 11/2008 | Lee et al. |
| 7,535,769 B2 | 5/2009 | Cernea |
| 7,546,438 B2 | 6/2009 | Chung |
| 7,562,198 B2 | 7/2009 | Noda et al. |
| 7,574,466 B2 | 8/2009 | Beaumont |
| 7,602,647 B2 | 10/2009 | Li et al. |
| 7,663,928 B2 | 2/2010 | Tsai et al. |
| 7,685,365 B2 | 3/2010 | Rajwar et al. |
| 7,692,466 B2 | 4/2010 | Ahmadi |
| 7,752,417 B2 | 7/2010 | Manczak et al. |
| 7,791,962 B2 | 9/2010 | Noda et al. |
| 7,796,453 B2 | 9/2010 | Riho et al. |
| 7,805,587 B1 | 9/2010 | Van Dyke et al. |
| 7,808,854 B2 | 10/2010 | Takase |
| 7,827,372 B2 | 11/2010 | Bink et al. |
| 7,869,273 B2 | 1/2011 | Lee et al. |
| 7,898,864 B2 | 3/2011 | Dong |
| 7,924,628 B2 | 4/2011 | Danon et al. |
| 7,937,535 B2 | 5/2011 | Ozer et al. |
| 7,957,206 B2 | 6/2011 | Bauser |
| 7,979,667 B2 | 7/2011 | Allen et al. |
| 7,996,749 B2 | 8/2011 | Ding et al. |
| 8,042,082 B2 | 10/2011 | Solomon |
| 8,045,391 B2 | 10/2011 | Mohklesi |
| 8,059,438 B2 | 11/2011 | Chang et al. |
| 8,095,825 B2 | 1/2012 | Hirotsu et al. |
| 8,117,462 B2 | 2/2012 | Snapp et al. |
| 8,164,942 B2 | 4/2012 | Gebara et al. |
| 8,208,328 B2 | 6/2012 | Hong |
| 8,213,248 B2 | 7/2012 | Moon et al. |
| 8,223,568 B2 | 7/2012 | Seo |
| 8,238,173 B2 | 8/2012 | Akerib et al. |
| 8,274,841 B2 | 9/2012 | Shimano et al. |
| 8,279,683 B2 | 10/2012 | Klein |
| 8,310,884 B2 | 11/2012 | Iwai et al. |
| 8,332,367 B2 | 12/2012 | Bhattacherjee et al. |
| 8,339,824 B2 | 12/2012 | Cooke |
| 8,339,883 B2 | 12/2012 | Yu et al. |
| 8,347,154 B2 | 1/2013 | Bahali et al. |
| 8,351,292 B2 | 1/2013 | Matano |
| 8,356,144 B2 | 1/2013 | Hessel et al. |
| 8,417,921 B2 | 4/2013 | Gonion et al. |
| 8,462,532 B1 | 6/2013 | Argyres |
| 8,484,276 B2 | 7/2013 | Carlson et al. |
| 8,495,438 B2 | 7/2013 | Roine |
| 8,503,250 B2 | 8/2013 | Demone |
| 8,526,239 B2 | 9/2013 | Kim |
| 8,533,245 B1 | 9/2013 | Cheung |
| 8,555,037 B2 | 10/2013 | Gonion |
| 8,599,613 B2 | 12/2013 | Abiko et al. |
| 8,605,015 B2 | 12/2013 | Guttag et al. |
| 8,625,376 B2 | 1/2014 | Jung et al. |
| 8,644,101 B2 | 2/2014 | Jun et al. |
| 8,650,232 B2 | 2/2014 | Stortz et al. |
| 8,873,272 B2 | 10/2014 | Lee |
| 8,964,496 B2 | 2/2015 | Manning |
| 8,971,124 B1 | 3/2015 | Manning |
| 9,015,390 B2 | 4/2015 | Klein |
| 9,047,193 B2 | 6/2015 | Lin et al. |
| 9,165,023 B2 | 10/2015 | Moskovich et al. |
| 9,449,674 B2 * | 9/2016 | Hush .................... G11C 11/4091 |
| 9,583,163 B2 * | 2/2017 | Tiwari .................... G11C 8/04 |
| 9,589,607 B2 * | 3/2017 | Manning .................... G11C 7/06 |

(56) References Cited

U.S. PATENT DOCUMENTS

| | | | |
|---|---|---|---|
| 9,659,610 B1* | 5/2017 | Hush | G11C 19/28 |
| 9,697,876 B1* | 7/2017 | Tiwari | G11C 7/065 |
| 9,704,540 B2* | 7/2017 | Manning | G11C 7/06 |
| 9,711,206 B2* | 7/2017 | Hush | G11C 11/4091 |
| 9,711,207 B2* | 7/2017 | Hush | G11C 11/4074 |
| 9,740,607 B2* | 8/2017 | Wheeler | G06F 12/0246 |
| 9,741,399 B2* | 8/2017 | Tiwari | G11C 7/065 |
| 9,741,427 B2* | 8/2017 | Hush | G11C 11/4091 |
| 9,747,960 B2* | 8/2017 | La Fratta | G11C 7/06 |
| 9,747,961 B2* | 8/2017 | Tiwari | G11C 7/10 |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |
| 2001/0043089 A1 | 11/2001 | Forbes et al. | |
| 2002/0059355 A1 | 5/2002 | Peleg et al. | |
| 2003/0167426 A1 | 9/2003 | Slobodnik | |
| 2003/0222879 A1 | 12/2003 | Lin et al. | |
| 2004/0073592 A1 | 4/2004 | Kim et al. | |
| 2004/0073773 A1 | 4/2004 | Demjanenko | |
| 2004/0085840 A1 | 5/2004 | Vali et al. | |
| 2004/0095826 A1 | 5/2004 | Perner | |
| 2004/0154002 A1 | 8/2004 | Ball et al. | |
| 2004/0205289 A1 | 10/2004 | Srinivasan | |
| 2004/0240251 A1 | 12/2004 | Nozawa et al. | |
| 2005/0015557 A1 | 1/2005 | Wang et al. | |
| 2005/0078514 A1 | 4/2005 | Scheuerlein et al. | |
| 2005/0097417 A1 | 5/2005 | Agrawal et al. | |
| 2006/0047937 A1 | 3/2006 | Selvaggi et al. | |
| 2006/0069849 A1 | 3/2006 | Rudelic | |
| 2006/0146623 A1 | 7/2006 | Mizuno et al. | |
| 2006/0149804 A1 | 7/2006 | Luick et al. | |
| 2006/0181917 A1 | 8/2006 | Kang et al. | |
| 2006/0215432 A1 | 9/2006 | Wickeraad et al. | |
| 2006/0225072 A1 | 10/2006 | Lari et al. | |
| 2006/0291282 A1 | 12/2006 | Liu et al. | |
| 2007/0103986 A1 | 5/2007 | Chen | |
| 2007/0171747 A1 | 7/2007 | Hunter et al. | |
| 2007/0180006 A1 | 8/2007 | Gyoten et al. | |
| 2007/0180184 A1 | 8/2007 | Sakashita et al. | |
| 2007/0195602 A1 | 8/2007 | Fong et al. | |
| 2007/0285131 A1 | 12/2007 | Sohn | |
| 2007/0285979 A1 | 12/2007 | Turner | |
| 2007/0291532 A1 | 12/2007 | Tsuji | |
| 2008/0025073 A1 | 1/2008 | Arsovski | |
| 2008/0037333 A1 | 2/2008 | Kim et al. | |
| 2008/0052711 A1 | 2/2008 | Forin et al. | |
| 2008/0137388 A1 | 6/2008 | Krishnan et al. | |
| 2008/0165601 A1 | 7/2008 | Matick et al. | |
| 2008/0178053 A1 | 7/2008 | Gorman et al. | |
| 2008/0215937 A1 | 9/2008 | Dreibelbis et al. | |
| 2009/0067218 A1 | 3/2009 | Graber | |
| 2009/0154238 A1 | 6/2009 | Lee | |
| 2009/0154273 A1 | 6/2009 | Borot et al. | |
| 2009/0254697 A1 | 10/2009 | Akerib | |
| 2010/0067296 A1 | 3/2010 | Li | |
| 2010/0091582 A1 | 4/2010 | Vali et al. | |
| 2010/0172190 A1 | 7/2010 | Lavi et al. | |
| 2010/0210076 A1 | 8/2010 | Gruber et al. | |
| 2010/0226183 A1 | 9/2010 | Kim | |
| 2010/0308858 A1 | 12/2010 | Noda et al. | |
| 2010/0332895 A1 | 12/2010 | Billing et al. | |
| 2011/0051523 A1 | 3/2011 | Manabe et al. | |
| 2011/0063919 A1 | 3/2011 | Chandrasekhar et al. | |
| 2011/0093662 A1 | 4/2011 | Walker et al. | |
| 2011/0103151 A1 | 5/2011 | Kim et al. | |
| 2011/0119467 A1 | 5/2011 | Cadambi et al. | |
| 2011/0122695 A1 | 5/2011 | Li et al. | |
| 2011/0140741 A1 | 6/2011 | Zerbe et al. | |
| 2011/0219260 A1 | 9/2011 | Nobunaga et al. | |
| 2011/0267883 A1 | 11/2011 | Lee et al. | |
| 2011/0317496 A1 | 12/2011 | Bunce et al. | |
| 2012/0005397 A1 | 1/2012 | Lim et al. | |
| 2012/0017039 A1 | 1/2012 | Margetts | |
| 2012/0023281 A1 | 1/2012 | Kawasaki et al. | |
| 2012/0120705 A1 | 5/2012 | Mitsubori et al. | |
| 2012/0134216 A1 | 5/2012 | Singh | |
| 2012/0134226 A1 | 5/2012 | Chow | |
| 2012/0135225 A1 | 5/2012 | Chow | |
| 2012/0140540 A1 | 6/2012 | Agam et al. | |
| 2012/0182798 A1 | 7/2012 | Hosono et al. | |
| 2012/0195146 A1 | 8/2012 | Jun et al. | |
| 2012/0198310 A1 | 8/2012 | Tran et al. | |
| 2012/0246380 A1 | 9/2012 | Akerib et al. | |
| 2012/0265964 A1 | 10/2012 | Murata et al. | |
| 2012/0281486 A1 | 11/2012 | Rao et al. | |
| 2012/0303627 A1 | 11/2012 | Keeton et al. | |
| 2013/0003467 A1 | 1/2013 | Klein | |
| 2013/0061006 A1 | 3/2013 | Hein | |
| 2013/0107623 A1 | 5/2013 | Kavalipurapu et al. | |
| 2013/0117541 A1 | 5/2013 | Choquette et al. | |
| 2013/0124783 A1 | 5/2013 | Yoon et al. | |
| 2013/0132702 A1 | 5/2013 | Patel et al. | |
| 2013/0138646 A1 | 5/2013 | Sirer et al. | |
| 2013/0163362 A1 | 6/2013 | Kim | |
| 2013/0173888 A1 | 7/2013 | Hansen et al. | |
| 2013/0205114 A1 | 8/2013 | Badam et al. | |
| 2013/0219112 A1 | 8/2013 | Okin et al. | |
| 2013/0227361 A1 | 8/2013 | Bowers et al. | |
| 2013/0283122 A1 | 10/2013 | Anholt et al. | |
| 2013/0286705 A1 | 10/2013 | Grover et al. | |
| 2013/0326154 A1 | 12/2013 | Haswell | |
| 2013/0332707 A1 | 12/2013 | Gueron et al. | |
| 2014/0185395 A1 | 7/2014 | Seo | |
| 2014/0215185 A1 | 7/2014 | Danielsen | |
| 2014/0250279 A1 | 9/2014 | Manning | |
| 2014/0344934 A1 | 11/2014 | Jorgensen | |
| 2015/0029798 A1 | 1/2015 | Manning | |
| 2015/0042380 A1 | 2/2015 | Manning | |
| 2015/0063052 A1 | 3/2015 | Manning | |
| 2015/0078108 A1 | 3/2015 | Cowles et al. | |
| 2015/0279466 A1 | 3/2015 | Manning | |
| 2015/0120987 A1 | 4/2015 | Wheeler | |
| 2015/0134713 A1 | 5/2015 | Wheeler | |
| 2015/0270015 A1 | 9/2015 | Murphy et al. | |
| 2015/0324290 A1 | 11/2015 | Leidel | |
| 2015/0325272 A1 | 11/2015 | Murphy | |
| 2015/0356009 A1* | 12/2015 | Wheeler | G06F 12/0638 |
| | | | 711/170 |
| 2015/0356022 A1 | 12/2015 | Leidel et al. | |
| 2015/0357007 A1 | 12/2015 | Manning et al. | |
| 2015/0357008 A1 | 12/2015 | Manning et al. | |
| 2015/0357019 A1 | 12/2015 | Wheeler et al. | |
| 2015/0357020 A1 | 12/2015 | Manning | |
| 2015/0357021 A1* | 12/2015 | Hush | G11C 11/4091 |
| | | | 365/72 |
| 2015/0357022 A1 | 12/2015 | Hush | |
| 2015/0357023 A1 | 12/2015 | Hush | |
| 2015/0357024 A1* | 12/2015 | Hush | G11C 11/4091 |
| | | | 365/72 |
| 2015/0357047 A1 | 12/2015 | Tiwari | |
| 2016/0062672 A1 | 3/2016 | Wheeler | |
| 2016/0062673 A1 | 3/2016 | Tiwari | |
| 2016/0062692 A1 | 3/2016 | Finkbeiner et al. | |
| 2016/0062703 A1 | 3/2016 | Tiwari | |
| 2016/0063284 A1 | 3/2016 | Tiwari | |
| 2016/0064045 A1* | 3/2016 | La Fratta | G11C 7/065 |
| | | | 365/189.011 |
| 2016/0064047 A1 | 3/2016 | Tiwari | |
| 2016/0098208 A1 | 4/2016 | Willcock | |
| 2016/0098209 A1 | 4/2016 | Leidel et al. | |
| 2016/0110135 A1 | 4/2016 | Wheeler et al. | |
| 2016/0125919 A1 | 5/2016 | Hush | |
| 2016/0154596 A1 | 6/2016 | Willcock et al. | |
| 2016/0155482 A1 | 6/2016 | La Fratta | |
| 2016/0188250 A1 | 6/2016 | Wheeler | |
| 2016/0196142 A1 | 7/2016 | Wheeler et al. | |
| 2016/0196856 A1 | 7/2016 | Tiwari et al. | |
| 2016/0225422 A1 | 8/2016 | Tiwari et al. | |
| 2016/0266873 A1 | 9/2016 | Tiwari et al. | |
| 2016/0266899 A1* | 9/2016 | Tiwari | G06F 9/3004 |

(56) References Cited

U.S. PATENT DOCUMENTS

| | | | |
|---|---|---|---|
| 2016/0267951 A1* | 9/2016 | Tiwari | G11C 11/4091 |
| 2016/0292080 A1 | 10/2016 | Leidel et al. | |
| 2016/0365129 A1* | 12/2016 | Willcock | G11C 7/065 |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing in Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.).

U.S. Appl. No. 13/743,686, entitled, "Weighted Search and Compare in a Memory Device," filed Jan. 17, 2013, (25 pgs.).

U.S. Appl. No. 13/774,636, entitled, "Memory as a Programmable Logic Device," filed Feb. 22, 2013, (30 pgs.).

U.S. Appl. No. 13/774,553, entitled, "Neural Network in a Memory Device," filed Feb. 22, 2013, (63 pgs.).

U.S. Appl. No. 13/796,189, entitled, "Performing Complex Arithmetic Functions in a Memory Device," filed Mar. 12, 2013, (23 pgs.).

International Search Report and Written Opinion for PCT Application No. PCT/US2013/043702, dated Sep. 26, 2013, (11 pgs.).

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

* cited by examiner

_US 10,014,034 B2_

SHIFTING DATA IN SENSING CIRCUITRY

TECHNICAL FIELD

The present disclosure relates generally to semiconductor memory and methods, and more particularly, to apparatuses and methods related to shifting data in sensing circuitry.

BACKGROUND

Memory devices are typically provided as internal, semiconductor, integrated circuits in computing systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Computing systems often include a number of processing resources (e.g., one or more processors), which may retrieve and execute instructions and store the results of the executed instructions to a suitable location. A processing resource can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations.

A number of components in a computing system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processing-in-memory (PIM) device, in which a processing resource may be implemented internal and/or near to a memory (e.g., directly on a same chip as the memory array). A PIM device may reduce time in processing and may also conserve power. Data movement between and within arrays and/or subarrays of various memory devices, such as PIM devices, can affect processing time and/or power consumption.

DETAILED DESCRIPTION

Figure 1:
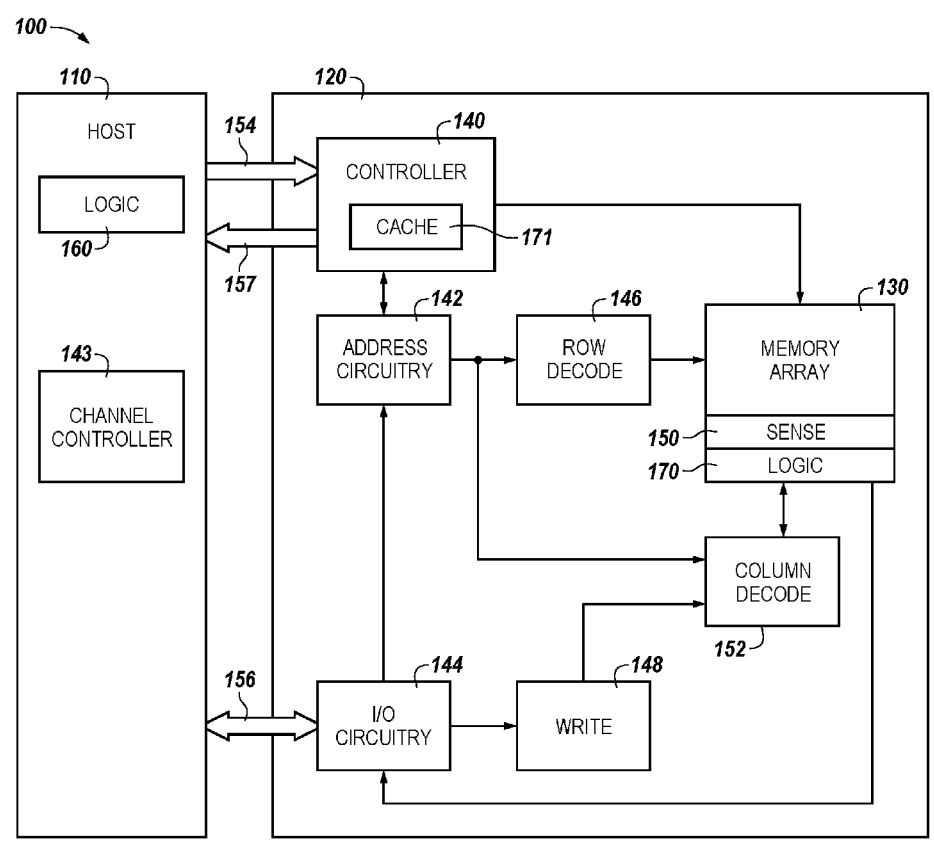
FIG. 1 is a block diagram of an apparatus in the form of a computing system including a memory device in accordance with a number of embodiments of the present disclosure.

The present disclosure includes apparatuses and methods related to shifting data in sensing circuitry. An example apparatus includes a first sensing component that includes a first sense amplifier coupled to a first pair of complementary sense lines. The first sensing component can include a first compute component that includes a number of first pass transistors. The example apparatus can include a second sensing component that includes a second sense amplifier coupled to a second pair of complementary sense lines. The second sensing component can include a second compute component that includes a number of second pass transistors. The first pair of complementary sense lines can be coupled to the number of first pass transistors and the number of second pass transistors.

In at least one embodiment described below, shifting functionality can be added to a memory device without adding additional transistors, without designating particular circuitry components for the shifting, and/or without adding additional circuit area. For example, a sensing component can use a number of first transistors (e.g., complement pass transistors) of an associated compute component to transfer a complement value associated with the first sensing component to the compute component. In addition, a true value associated with the first sensing component can be transferred through a number of second transistors (e.g., load pass transistors) of an adjacent compute component associated with an adjacent sensing component. In this way, the value stored in the associated sensing component can be accessible by the adjacent sensing component in order to perform operations on the value of the sensing component and a value associated with the adjacent sensing component (e.g., stored in the sense amplifier of the adjacent sensing component).

In some embodiments, each discrete collection of elements that comprise sensing circuitry may be referred to as a "sensing component." For example, a sense amplifier, Boolean logic, a compute component, pass transistors (e.g., load pass transistors and complement pass transistors), when taken together, may be referred to as a "sensing component." In some embodiment, a sensing component may be connected to another sensing component such that data values (e.g., bits) may be moved (e.g., shifted) from one sensing component to another sensing component. Shifting data values between one sensing component and another sensing component may be done synchronously such that a sensing component receives a data value from another sensing component as the sensing component passes its data value to yet another sensing component. In some embodiments, shifting data in sensing circuitry can facilitate various processing functions such as the multiplication, addition, etc., of two operands.

Embodiments of the present disclosure seek to reduce the amount of circuitry space while maintain an ability to access multiple columns of data (e.g., multiple sets of sense lines accessible by a particular sense amplifier and/or compute component). For example, a number of embodiments of the present disclosure can facilitate shifting data in sensing circuitry in a more efficient manner as compared to previous approaches. Embodiments include implementing various data shifting techniques in novel circuit architectures, for example, circuit architectures including sensing circuitry associated with a PIM device. An example method includes moving a data value stored in a sensing component, the sensing component including a sense amplifier and a compute component, where moving the data value includes using load pass transistors and complement pass transistors previously allocated with other purposes. Some embodiments may include coupling a particular number of sensing components in a ring architecture for more efficient accessible for that ring of sensing component. By applying these sharing techniques and/or by coupling particular sensing components in a ring, a reduction in circuitry area associated with shifting data can be realized in comparison with some approaches.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "n", particularly with respect to reference numerals in the drawings, indicate that a number of the particular feature so designated can be included. As used herein, "a number of" a particular thing refers to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 350 in FIG. 3. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, channel controller 143, memory array 130, sensing circuitry 150, logic circuitry 170, and/or cache 171 might also be separately considered an "apparatus."

The system 100 includes a host 110 coupled (e.g., connected) to memory device 120, which includes a memory array 130. The host 110 can be a host system such as a personal laptop computer, a desktop computer, a digital camera, a smart phone, or a memory card reader, among various other types of hosts. The host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by digit lines, which may be referred to herein as data lines or sense lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals for data provided over a data bus 156 (e.g., an I/O bus) through I/O circuitry 144. Status and/or exception information can be provided from the controller 140 on the memory device 120 to a channel controller 143, through a high speed interface (HSI) including an out-of-band bus 157, which in turn can be provided from the channel controller 143 to the host 110. Address signals are received through address circuitry 142 and decoded by a row decoder 146 and a column decoder 152 to access the memory array 130. Data can be read from memory array 130 by sensing voltage and/or current changes on the digit lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 can be used to write data to the memory array 130.

The controller 140 (e.g., memory controller) decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine, sequencer, or some other type of controller, and include hardware and/or firmware (e.g., microcode instructions) in the form of an application specific integrated circuit (ASIC). In some embodiments, the controller 140 may include cache 171. The controller 140 can control, for example, generation of clock signals and application of the clock signals to a compute component in sensing circuitry in association with shifting data in accordance with embodiments described herein.

As described further below, in a number of embodiments, the sensing circuitry 150 can comprise a sense amplifier and a compute component. The compute component may also be referred to herein as an accumulator, and can be used to perform logical operations (e.g., on data associated with complementary digit lines). According to various embodiments, the compute component comprises a number of pass transistors. The number of pass transistors can include a number of load pass transistors and a number of complement pass transistors. For example, a true value can be transferred through the number of load pass transistors to be stored in the compute component. Likewise, a complement value can be transferred through the number of complement pass transistors to be stored in the compute component.

In a number of embodiments, the sensing circuitry 150 can be used to perform logical operations using data stored in array 130 as inputs and/or store the results of the logical operations back to the array 130 without transferring data via a digit line address access (e.g., without firing a column decode signal). As such, various compute functions (e.g., a mathematical calculation, a mathematical determination, etc.) can be performed using, and within, sensing circuitry 150 rather than (or in association with) being performed by processing resources external to the sensing circuitry (e.g., by a processing resource associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 and store the result back to the memory array 130 without enabling an I/O line (e.g., a local I/O line) coupled to the sensing circuitry 150. The sensing circuitry 150 can be formed on pitch with the memory cells of the array. Additional logic circuitry 170 can be coupled to the sensing circuitry 150 and can be used to store (e.g., cache and/or buffer) results of operations described herein.

Enabling an I/O line (e.g., I/O line 301 in FIG. 3) can include enabling (e.g., turning on) a transistor having a gate coupled to a decode signal (e.g., a column decode signal) and a source/drain coupled to the I/O line. However, embodiments are not limited to performing logical operations using sensing circuitry (e.g., 150) without enabling column decode lines of the array. Whether or not local I/O lines are used in association with performing logical operations via sensing circuitry 150, the local I/O line(s) may be enabled in order to transfer a result to a suitable location other than back to the array 130 (e.g., to an external register).

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to compliment and/or to replace, at least to some extent, such an external processing resource (or at least the bandwidth consumption of such an external processing resource).

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations.

In at least one embodiment, data stored in a first sensing component of the sensing circuitry 150 can be transferred to a corresponding first compute component of the first sensing component and to a compute component of a second sensing component adjacent the first sensing component without adding additional shifting circuitry. For example, data stored in a memory array 130 can be transferred through a number of pass transistors of the first compute component of sensing circuitry 150 to be stored in the first compute component. In addition, the data can be transferred through a number of pass transistors of the second compute component to be stored in the second compute component. In this way, existing circuitry can be reallocated for use by the sensing circuitry 150 to transfer data from a first sensing component to a second sensing component and to additional sensing components without adding additional circuitry footprint.

Figure 2:
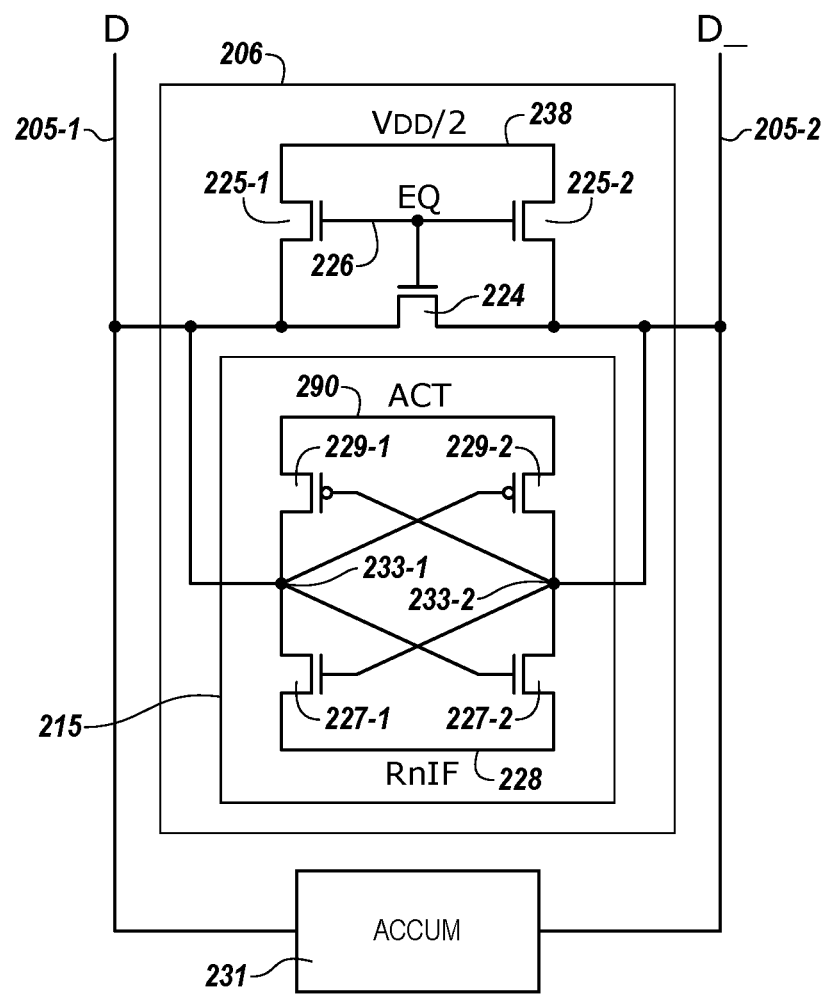
FIG. 2 is a schematic diagram of a portion of a memory array including sensing circuitry in accordance with a number of embodiments of the present disclosure.

FIG. 2 is a schematic diagram illustrating a portion of sensing circuitry in accordance with a number of embodiments of the present disclosure. The sensing circuitry shown in FIG. 2 comprises a sense amplifier 206 and a compute component 231. The compute component 231 can have various architectures such as those described in association with FIG. 2 and described below in association with FIG. 3. In a number of embodiments, the compute component comprises an accumulator having an associated dynamic latch, for instance. In a number of embodiments, a sense amplifier (e.g., 206) can comprise a number of transistors formed on pitch with the transistors of the corresponding compute component (e.g., 231) and/or the memory cells of an array (e.g., array 430 shown in FIG. 4) to which they are coupled, which may conform to a particular feature size (e.g., $4F^2$, $6F^2$, etc.).

As described further below, the sense amplifier 206 can, in conjunction with the compute component 231, be operated to perform various logical operations using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments eliminate the need to transfer data across I/O lines in order to perform compute functions (e.g., between memory and discrete processor), a number of embodiments can enable an increased parallel processing capability as compared to previous approaches.

In the example illustrated in FIG. 2, the circuitry corresponding to sense amplifier 206 comprises a latch 215 including four transistors coupled to a pair of complementary data lines D 205-1 and D_ 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2). As described further herein, the cross coupled latch 215 comprising transistors 227-1, 227-2, 229-1, and 229-2 can be referred to as a primary latch.

The voltages or currents on the respective data lines D and D_ can be provided to the respective latch inputs 233-1 and 233-2 of the cross coupled latch 215 (e.g., the input of the secondary latch). In this example, the latch input 233-1 is coupled to a first source/drain region of transistors 227-1 and 229-1 as well as to the gates of transistors 227-2 and 229-2. Similarly, the latch input 233-2 can be coupled to a first source/drain region of transistors 227-2 and 229-2 as well as to the gates of transistors 227-1 and 229-1. The compute component 231 (e.g., accumulator) can be coupled to latch inputs 233-1 and 233-2 of the cross coupled latch 215 as shown; however, embodiments are not limited to the example shown in FIG. 2.

In this example, a second source/drain region of transistor 227-1 and 227-2 is commonly coupled to a negative control signal 228 (RnIF). A second source/drain region of transistors 229-1 and 229-2 is commonly coupled to a positive control signal 290 (ACT). The ACT signal 290 can be a supply voltage (e.g., $V_{DD}$) and the RnIF signal can be a reference voltage (e.g., ground). Activating signals 228 and 290 enables the cross coupled latch 215.

The enabled cross coupled latch 215 operates to amplify a differential voltage between latch input 233-1 (e.g., first common node) and latch input 233-2 (e.g., second common node) such that latch input 233-1 is driven to one of the ACT signal voltage and the RnIF signal voltage (e.g., to one of $V_{DD}$ and ground), and latch input 233-2 is driven to the other of the ACT signal voltage and the RnIF signal voltage.

The sense amplifier 206 can also include circuitry configured to equilibrate the data lines D and D_ (e.g., in association with preparing the sense amplifier for a sensing operation). In this example, the equilibration circuitry comprises a transistor 224 having a first source/drain region coupled to a first source/drain region of transistor 225-1 and data line D 205-1. A second source/drain region of transistor 224 can be coupled to a first source/drain region of transistor 225-2 and data line D_ 205-2. A gate of transistor 224 can be coupled to gates of transistors 225-1 and 225-2.

The second source drain regions of transistors 225-1 and 225-2 are coupled to an equilibration voltage 238 (e.g., $V_{DD}/2$), which can be equal to $V_{DD}/2$, where $V_{DD}$ is a supply voltage associated with the array. The gates of transistors 224, 225-1, and 225-2 can be coupled to control signal 225 (EQ). As such, activating EQ enables the transistors 224, 225-1, and 225-2, which effectively shorts data line D to data line D_ such that the data lines D and D_ are equilibrated to equilibration voltage $V_{DD}/2$. According to various embodiments of the present disclosure, a number of logical operations can be performed using the sense amplifier, and storing the result in the compute component (e.g., accumulator).

As described further below, a data value stored in the sense amplifier 206 can be transferred to the compute component 231 through a number of pass transistors (e.g., pass transistors 439 and 441 in FIG. 4). In addition, the data value stored in the sense amplifier 206 can be transferred to an adjacent compute component of an adjacent sensing component (not illustrated) without adding additional shifting circuitry.

Figure 3:
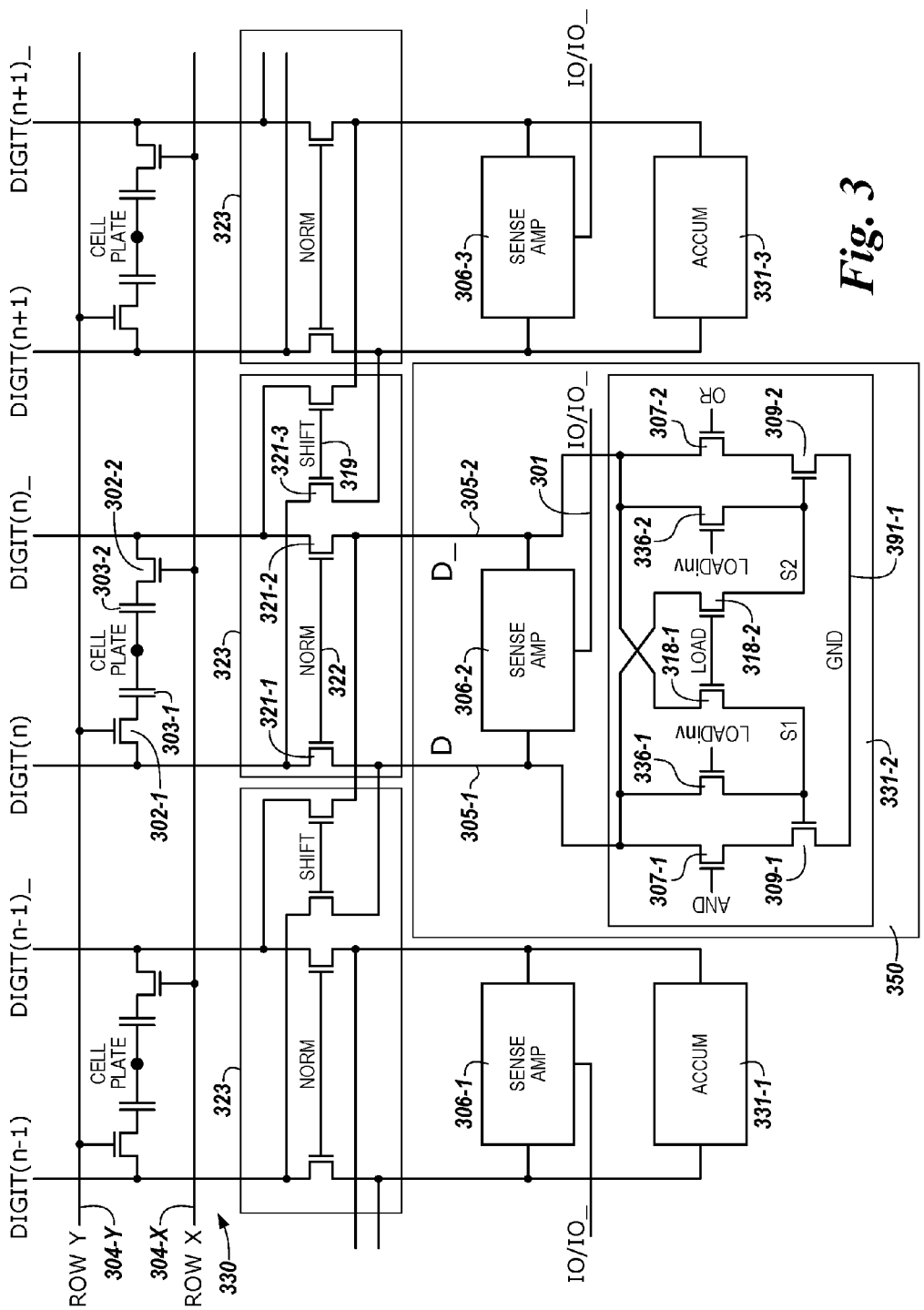
FIG. 3 is a schematic diagram illustrating sensing circuitry in accordance with a number of embodiments of the present disclosure.

FIG. 3 is a schematic diagram illustrating sensing circuitry in accordance with a number of embodiments of the present disclosure. The circuit illustrated in FIG. 3 is similar to the circuit illustrated in FIG. 2 but with an alternative compute component 331-2 configuration having a modified invert implementation, as shown in FIG. 3 (and described below). The circuit illustrated in FIG. 3 can have a sense amplifier 306-2 coupled between data lines D 305-1 and D_ 305-2, and can have shift circuitry 323 coupled intermediate within and between different pairs of data lines D 305-1 and D_ 305-2, for example.

As shown in FIG. 3, the sense amplifier 306 and the compute component 331-2 can be coupled to the array 330 via shift circuitry 323. In this example, the shift circuitry 323 comprises a pair of isolation devices 321-1 and 321-2 (e.g., isolation transistors 321-1 and 321-2) coupled to data lines 305-1 (D) and 305-2 (D_), respectively). The isolation transistors 321-1 and 321-2 are coupled to a control signal 322 (NORM) that, when activated, enables (e.g., turns on) the isolation transistors 321-1 and 321-2 to couple the corresponding sense amplifier 306-2 and compute component 331-2 to a corresponding column of memory cells (e.g., to a corresponding pair of complementary data lines 305-1 (D) and 305-2 (D_)). According to various embodiments, conduction of isolation transistors 321-1 and 321-2 can be referred to as a "normal" configuration of the shift circuitry 323.

In the example illustrated in FIG. 3, the shift circuitry 323 includes another (e.g., a second) pair of isolation devices (e.g., transistors 321-3 and 321-4) coupled to a complementary control signal 319 (SHIFT), which can be activated, for example, when NORM is deactivated. The isolation transistors 321-3 and 321-4 can be operated (e.g., via control signal 319) such that a particular sense amplifier 306-2 and compute component 331-2 are coupled to a different pair of complementary data lines (e.g., a pair of complementary data lines different than the pair of complementary data lines to which isolation transistors 321-1 and 321-2 couple the particular sense amplifier 306 and compute component 331), or can couple a particular sense amplifier 306 and compute component 331 to another memory array (and isolate the particular sense amplifier 306 and compute component 331 from a first memory array). According to various embodiments, the shift circuitry 323 can be arranged as a portion of (e.g., within) the sense amplifier 306, for instance.

Although the shift circuitry 323 shown in FIG. 3 includes isolation transistors 321-1 and 321-2 used to couple particular sensing circuitry 350 (e.g., a particular sense amplifier 306 and corresponding compute component 331) to a particular pair of complementary data lines 305-1 (D) and 305-2 (D_) (e.g., DIGIT(n) and DIGIT(n)_) and isolation transistors 321-3 and 321-4 are arranged to couple the particular sensing circuitry 350 to an adjacent pair of complementary data lines in one particular direction (e.g., adjacent data lines DIGIT(n+1) and DIGIT(n+1)_ shown to the right in FIG. 3), embodiments of the present disclosure are not so limited. For instance, shift circuitry can include isolation transistors 321-1 and 321-2 used to couple particular sensing circuitry to a particular pair of complementary data lines (e.g., DIGIT(n) and DIGIT(n)_ and isolation transistors 321-3 and 321-4 arranged so as to be used to couple the particular sensing circuitry to an adjacent pair of complementary data lines in another particular direction (e.g., adjacent data lines DIGIT(n−1) and DIGIT(n−1)_ shown to the left in FIG. 3).

In the example illustrated in FIG. 3, the circuitry corresponding to compute component 331-2 implements a latch (e.g., a secondary latch) that includes eight transistors. The compute component 331-2 can operate as/be, for example, an accumulator. The compute component 331-2 can be coupled to each of the data lines D 305-1 and D_ 305-2 as shown in FIG. 3. However, embodiments are not limited to this example. The transistors of compute component 331-2 can all be n-channel transistors (e.g., NMOS transistors), for example.

The voltages or currents on the respective data lines D 305-1 and D_ 305-2 can be communicated to the respective inputs of the compute component 331-2 (e.g., inputs of the secondary latch). In this example, data line D 305-1 can be coupled to a first source/drain region of a first pass transistor 307-1 as well as to a first source/drain region of load transistor 318-2 and invert transistor 336-1. Data line D_ 305-2 can be coupled to a first source/drain region of pass transistor 307-2 as well as to a first source/drain region of load transistor 318-1 and invert transistor 336-2.

The gates of load transistor 318-1 and 318-2 can be commonly coupled to a LOAD control signal. A second source/drain region of load transistor 318-1 can be directly coupled to a gate of transistor 309-1, the gate of transistor 309-1 being referred to as node S1. A second source/drain region of load transistor 318-2 can be directly coupled to a gate of transistor 309-2, the gate of transistor 309-2 being referred to as node S2.

A second source/drain region of inverting transistor 336-1 can be directly coupled to a gate of transistor 309-1 and a second source/drain region of load transistor 318-1. A second source/drain region of inverting transistor 336-2 can be directly coupled to a gate of transistor 309-2 and a second source/drain region of load transistor 318-2. A second source/drain region of transistors 309-1 and 309-2 can be commonly coupled to a negative reference signal control line 391-1 providing a reference signal (e.g., ground (GND)). A gate of pass transistor 307-1 can be coupled to a control signal AND. A gate of pass transistor 307-2 can be coupled to a control signal OR. A gate of invert transistor 336-1 can be coupled to a control signal LOADinv. A gate of invert transistor 336-2 can also be coupled to the control signal LOADinv.

The circuit shown in FIG. 3 stores accumulator data dynamically on nodes S1 and S2. Activating the LOAD control signal causes load transistors 318-1 and 318-2 to conduct, and thereby load complementary data onto nodes S1 and S2. Note however that the data value corresponding to data line D_ 305-2 is loaded onto node S1 and the data value corresponding to data line D 305-1 is loaded onto node S2. The LOAD control signal can be elevated to a voltage greater than $V_{DD}$ to pass a full $V_{DD}$ level to S1/S2. However, elevating the LOAD control signal to a voltage greater than $V_{DD}$ is optional, and functionality of the circuit shown in FIG. 3 is not contingent on the LOAD control signal being elevated to a voltage greater than $V_{DD}$.

According to various embodiments of the present disclosure, the circuit of FIG. 3 can be operated to load a true or complement data value into the accumulator, rather than loading a true data value into the accumulator and subsequently selecting to use the true or complement data value while performing operations to implement logical operations, as described with respect to the circuit illustrated in FIG. 3. The NOT (e.g., invert) function can be accomplished using the circuit illustrated in FIG. 3 by first loading the inverse data value into the accumulator directly, which can be subsequently used without further operations to invert it.

Figure 4:
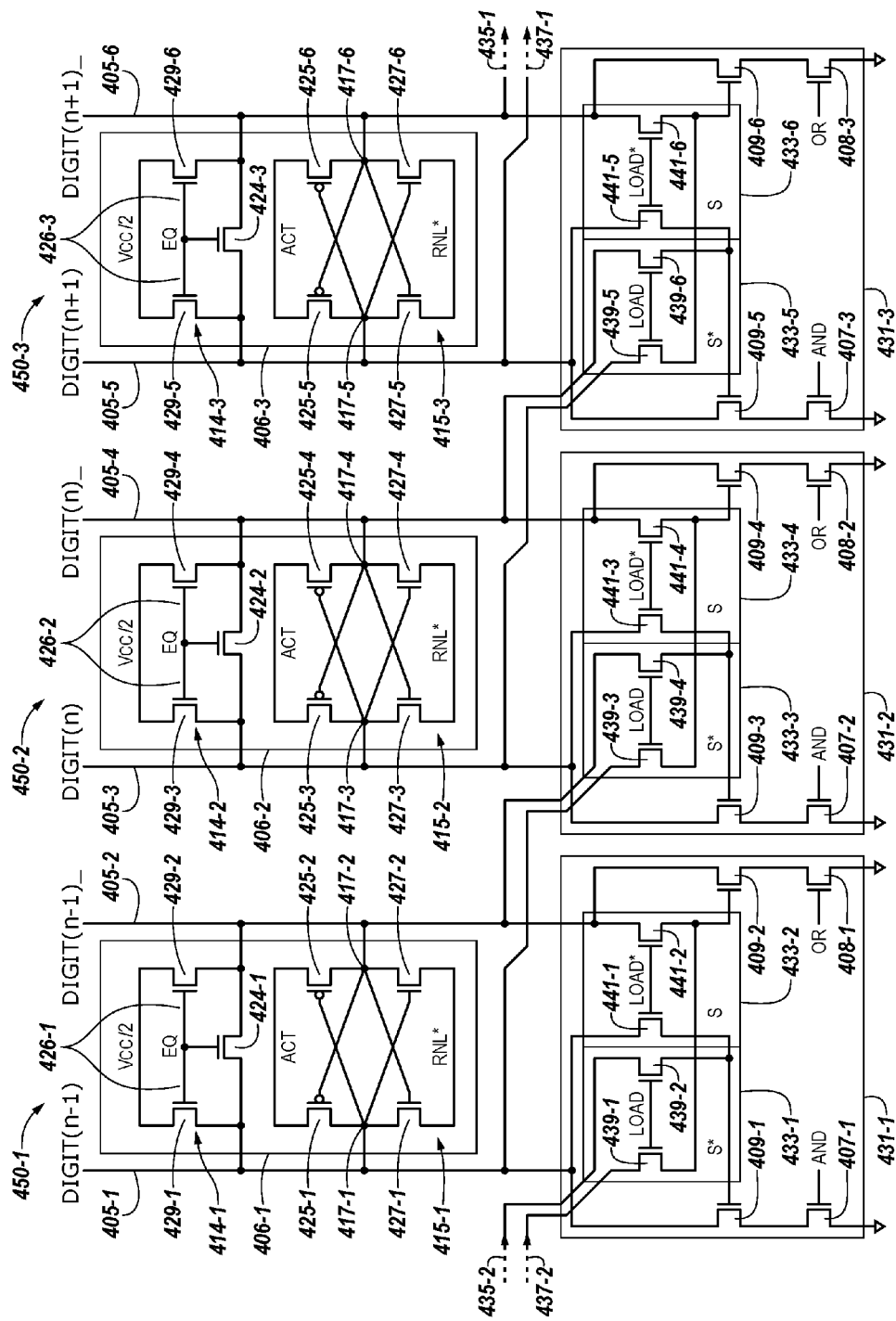
FIG. 4 is a schematic diagram illustrating sensing circuitry having selectable logical operation selection logic in accordance with a number of embodiments of the present disclosure.

FIG. 4 is a schematic diagram illustrating sensing circuitry in accordance with a number of embodiments of the present disclosure. FIG. 4 illustrates an example of a first sensing component 450-1, a second sensing component 450-2, a third sensing component 450-3, etc. As an example, the sensing components 450-1 to 450-3 are similar to the sensing component 250 described in FIG. 2.

The cells of the memory array 230 can be arranged in rows coupled by access lines (e.g., 204-X (Row X), 204-Y (Row Y), etc. in FIG. 2), and columns coupled by pairs of complementary digit lines (e.g., digit lines 405-1 labelled DIGIT(n−1), 405-2 labelled DIGIT(n−1)_, 405-3 labelled DIGIT(n), 405-4 labelled DIGIT(n)_, 405-5 labelled DIGIT(n+1), 405-6 labelled DIGIT(n+1)_). Although three pairs of complementary digit lines are shown in FIG. 4, embodiments of the present disclosure are not so limited, and an array of memory cells can include additional columns of memory cells and complementary digit lines (e.g., 4,096, 8,192, 16,384, etc.).

In some embodiments, memory cells can be coupled to different digit lines and word lines. For instance, the digit lines 405-1 and 405-2 are coupled to a first sensing component 450-1, digit lines 405-3 and 405-4 are coupled to a second sensing component 450-2, and digit lines 405-5 and 405-6 are coupled to a third sensing component 450-3 in accordance with a number of embodiments of the present disclosure. In this example, the first sensing component 450-1 comprises a first sense amplifier 406-1 comprising a first equilibration circuitry 414-1, which can be configured to equilibrate the digit lines 405-1 and 405-2. The equilibration circuitry 414-1 comprises a transistor 424-1 coupled between digit lines 405-1 and 405-2. The equilibration circuitry 414-1 also comprises transistors 425-1 and 425-2 each having a first source/drain region coupled to an equilibration voltage (e.g., $V_{DD}/2$), where $V_{DD}$ is a supply voltage associated with the array. A second source/drain region of transistor 425-1 is coupled to digit line 405-1, and a second source/drain region of transistor 425-2 is coupled to digit line 405-2. Gates of transistors 424-1, 425-1, and 425-2 can be coupled together and to an equilibration (EQ) control signal line 426-1. As such, activating EQ enables the transistors 424-1, 425-1, and 425-2, which effectively shorts digit lines 405-1 and 405-2 together and to the equilibration voltage (e.g., $V_{DD}/2$).

The first sensing component 450-1 comprises a first compute component 431-1 that comprises a number of first pass transistors 433-1 ("LOAD" pass transistors) and a number of second pass transistors 433-2 (e.g., "LOAD*" pass transistors). The number of first pass transistors 433-1 can include a first transistor 439-1 (e.g., a first load pass transistor) and a second transistor 439-2 (e.g., a second load pass transistor). The first transistor 439-1 can be coupled, illustrated at 437-2, to a first digit line (not illustrated) of a sensing component (not illustrated) adjacent and prior to the first sensing component 450-1 and to a transistor 409-2 through the digit line 405-2. The second transistor 439-2 can be coupled, illustrated at 435-2, to a second digit lint of the adjacent and prior sensing component (not illustrated) and to the transistor 409-1 through digit line 405-1.

The number of second pass transistors 433-2 can include a first transistor 441-1 (e.g., a first complement pass transistor) and a second transistor 441-2 (e.g., a second complement pass transistor). The first transistor 441-1 can be coupled to the transistor 409-1 and to the digit line 405-1 (DIGIT(n−1)). The second transistor 441-2 can be coupled to the transistor 409-2 and to the digit line 405-2 (DIGIT (n−1)_). The number of first pass transistors 433-1 can be associated with a true value of a value stored in a neighboring sense amplifier and the number of second pass transistors 433-2 can be associated with a complement value of the value stored in the sense amplifier 406-1. For example, when the first sensing component 450-1 is coupled to a memory cell storing a bit value of "1," the complement value of "0" can be transferred to the compute component 431-1 through the number of second pass transistors 433-2. Further, as described below, when a neighboring sensing component is coupled to a memory cell storing a bit value of "1," the true value of "1" can be transferred to the compute component 431-1 through the number of first pass transistors 433-1.

The first compute component 431-1 includes a first pass transistor 407-1 ("AND") having a first source/drain region directly coupled (e.g., connected) to a first source/drain region of transistor 409-1, which is directly coupled to digit line 405-1. The first compute component 431-1 includes a second pass transistor 408-1 ("OR") having a first source/drain region directly coupled to a first source/drain region of transistor 409-2, which is directly coupled to digit line 405-2.

In a likewise fashion, a second sensing component 450-2 comprises a second sense amplifier 406-2 comprising a second equilibration circuitry 414-2 which can be configured to equilibrate digit lines 405-3 and 405-4. The equilibration circuitry 414-2 comprises a transistor 424-2 coupled between digit lines 405-3 and 405-4. The equilibration circuitry 414-2 also comprises transistors 425-3 and 425-4 each having a first source/drain region coupled to an equilibration voltage (e.g., $V_{DD}/2$), where $V_{DD}$ is a supply voltage associated with the array. A second source/drain region of transistor 425-3 is coupled to digit line 405-3, and a second source/drain region of transistor 425-4 is coupled to digit line 405-4. Gates of transistors 424-2, 425-3, and 425-4 can be coupled together and to an equilibration (EQ) control signal line 426-2. As such, activating EQ enables the transistors 424-2, 425-3, and 425-4, which effectively shorts digit lines 405-3 and 405-4 together and to the equilibration voltage (e.g., $V_{DD}/2$).

The second sensing component 450-2 comprises a second compute component 431-2 that comprises a number of third pass transistors 433-3 ("LOAD" pass transistors) and a number of fourth pass transistors 433-4 (e.g., "LOAD*" pass transistors). The number of third pass transistors 433-3 can include a third transistor 439-3 (e.g., a third load pass transistor) and a fourth transistor 439-4 (e.g., a fourth load pass transistor). The third transistor 439-3 can be coupled to the digit line 405-1 (DIGIT(n−1)) of the first sensing component 450-1 (adjacent and prior to) the second sensing component 450-2 and to a transistor 409-4 through the digit line 405-4. The fourth transistor 439-4 can be coupled to the digit line 405-2 (DIGIT(n−1)_) of the first sensing component 450-1 and to the transistor 409-3 through digit line 405-3.

The number of fourth pass transistors 433-4 can include a third transistor 441-3 (e.g., a third complement pass transistor) and a fourth transistor 441-4 (e.g., a fourth complement pass transistor). The third transistor 441-3 can be coupled to the transistor 409-3 and to the digit line 405-3 (DIGIT(n)). The fourth transistor 441-4 can be coupled to the transistor 409-4 and to the digit line 405-4 (DIGIT(n)_). The number of third pass transistors 433-3 can be associated with a true value of a value stored in the first sense amplifier 406-1 and the number of fourth pass transistors 433-4 can be associated with a complement value of the value stored in the second sense amplifier 406-2. For example, when the second sensing component 450-2 is coupled to a memory cell storing a bit value of "1," the complement value of "0" can be transferred to the compute component 431-2 through the number of fourth pass transistors 433-4. Further, when the first sensing component is coupled to a memory cell storing a bit value of "1," the true value of "1" can be transferred to the second compute component 431-2 through the number of third pass transistors 433-3.

The second compute component 431-2 includes a pass transistor 407-2 ("AND") having a first source/drain region directly coupled (e.g., connected) to a first source/drain region of transistor 409-3, which is directly coupled to digit line 405-3. The second compute component 431-2 includes a pass transistor 408-2 ("OR") having a first source/drain region directly coupled to a first source/drain region of transistor 409-4, which is directly coupled to digit line 405-4.

Further, a third sensing component 450-3 comprises a third sense amplifier 406-3 comprising a third equilibration circuitry 414-3 which can be configured to equilibrate digit lines 405-5 and 405-6. The equilibration circuitry 414-3 comprises a transistor 424-3 coupled between digit lines 405-5 and 405-6. The equilibration circuitry 414-3 also comprises transistors 425-5 and 425-6 each having a first source/drain region coupled to an equilibration voltage (e.g., $V_{DD}/2$), where $V_{DD}$ is a supply voltage associated with the array. A second source/drain region of transistor 425-5 is coupled to digit line 405-5, and a second source/drain region of transistor 425-6 is coupled to digit line 405-6. Gates of transistors 424-3, 425-5, and 425-6 can be coupled together and to an equilibration (EQ) control signal line 426-3. As such, activating EQ enables the transistors 424-3, 425-5, and 425-6, which effectively shorts digit lines 405-5 and 405-6 together and to the equilibration voltage (e.g., $V_{DD}/2$).

The third sensing component 450-3 comprises a third compute component 431-3 that comprises a number of fifth pass transistors 433-5 ("LOAD" pass transistors) and a number of sixth pass transistors 433-6 (e.g., "LOAD*" pass transistors). The number of fifth pass transistors 433-5 can include a fifth transistor 439-5 (e.g., a fifth load pass transistor) and a sixth transistor 439-6 (e.g., a sixth load pass transistor). The fifth transistor 439-5 can be coupled to the digit line 405-3 (DIGIT(n)) of the second sensing component 450-2 (adjacent and prior to) the third sensing component 450-3 and to a transistor 409-6 through the digit line 405-6. The sixth transistor 439-6 can be coupled to the digit line 405-4 (DIGIT(n)_) of the second sensing component 450-2 and to the transistor 409-5 through digit line 405-5.

The number of sixth pass transistors 433-6 can include a fifth transistor 441-5 (e.g., a fifth complement pass transistor) and a sixth transistor 441-6 (e.g., a sixth complement pass transistor). The fifth transistor 441-5 can be coupled to the transistor 409-5 and to the digit line 405-5 (DIGIT(n+1)). The sixth transistor 441-6 can be coupled to the transistor 409-6 and to the digit line 405-6 (DIGIT(n+1)_). The number of fifth pass transistors 433-5 can be associated with a true value of a value stored in the second sense amplifier 406-2 and the number of sixth pass transistors 433-6 can be associated with a complement value of the value stored in the third sense amplifier 406-3. For example, when the third sensing component 450-3 is coupled to a memory cell storing a bit value of "1," the complement value of "0" can be transferred to the compute component 431-3 through the number of sixth pass transistors 433-6. Further, when the second sensing component is coupled to a memory cell storing a bit value of "1," the true value of "1" can be transferred to the third compute component 431-3 through the number of fifth pass transistors 433-5.

The third compute component 431-3 includes a pass transistor 407-3 ("AND") having a first source/drain region directly coupled (e.g., connected) to a first source/drain region of transistor 409-5, which is directly coupled to digit line 405-5. The third compute component 431-3 includes a pass transistor 408-3 ("OR") having a first source/drain region directly coupled to a first source/drain region of transistor 409-6, which is directly coupled to digit line 405-6.

While the examples in FIG. 4 illustrate a true value being transferred from a first sensing component to a second sensing component and a complement value being transferred from a sense amplifier to a corresponding compute component of the same second sensing component, embodiments are not so limited. For example, a complement value can be transferred from the first sensing component to the second sensing component through a number of complement pass transistors and a true value can be transferred from a sense amplifier to a corresponding compute component of the same sensing component through a number of load pass transistors.

While three sensing components are illustrated, embodiments are not so limited. For example, an additional fourth sensing component (not illustrated) subsequent to the third sensing component 450-3 can comprise a fourth compute component 431-4 that comprises a number of seventh pass transistors ("LOAD" pass transistors) and a number of eighth pass transistors (e.g., "LOAD*" pass transistors). The number of seventh pass transistors can include a seventh transistor (e.g., a seventh load pass transistor) and an eighth transistor (e.g., an eighth load pass transistor). The seventh transistor can be coupled, as illustrated at 437-1, to the digit line 405-5 of the third sensing component (adjacent and prior to) the fourth sensing component and to a transistor through a second digit line of the fourth sensing component. The eighth transistor can be coupled to the digit line 405-6 (DIGIT(n+1)_) of the third sensing component 450-3 and to a transistor through the first digit line of the fourth sensing component.

In at least one embodiment, the number of first pass transistors can be coupled to the digit lines of the third sensing component 450-3. For example, the first transistor 439-1 can be coupled, which in this example would be illustrated by 437-2 being coupled to 437-1, to the digit line 405-5 (DIGIT(n+1)). The second transistor 439-2 can be coupled, which in this example would be illustrated by 435-2 being coupled to 435-1, to the digit line 405-6 (DIGIT(n+1)_). In this way, a ring of three sensing components coupled together can be formed. However, embodiments are not so limited. Any number of sensing components can form a ring. For example, two sensing components can form a ring, three sensing components can form a ring (as illustrated), four sensing components can form a ring, etc. In the example case of two sensing component forming a ring, data stored in each corresponding sensing component can be swapped as data is moved through each corresponding transistor to an adjacent and/or subsequent sensing component.

In at least one embodiment, the setup described above can include shifting data from a memory cell coupled to a first digit line (e.g., digit line 405-1) of a first sensing component (e.g., sensing component 450-1) to a compute component (e.g., compute component 431-2) of a subsequent sensing component (e.g., sensing component 450-2) without adding additional transistors and/or circuitry. For example, data from a memory cell coupled to digit line 405-1 can be shifted to a compute component 431-2 of the second sensing component 450-2 and data from a memory cell coupled to digit line 405-2 can be shifted to the compute component 431-2 of the sensing component 450-2. The shifted data can be relocated in the sense amplifier 406-2 or operated on in the compute component 431-2. The shifted data can be shifted from the digit lines 405-3 and 405-4 to the compute component 431-3 in the third sensing component 450-3. Subsequently, the shifted data can be shifted from the data lines 405-5 and 405-6 to the compute component 431-1 in the first sensing component (if the data lines 405-5 and 405-6 are coupled to the compute component 431-1 directly in a three sensing component ring, as described above). In this way, data can be shifted across a number of sensing components within a ring of sensing components in order for operations to be performed on the data.

In at least one embodiment, a number of operations can be performed on values stored in more than one sensing component within a sensing component. For example, a value stored in a first sense amplifier of a first sensing component can be transferred to a compute component of a second (and adjacent) compute component of a second sensing component (adjacent the first sensing component). The second sensing component can include a second sense amplifier storing an additional value and an operation can be performed on the value stored in the second compute component and the additional value stored in the second sense amplifier. In this way, additional data values corresponding to more than one sensing component can be accessed by a single sensing component for performing operations.

Figure 5:
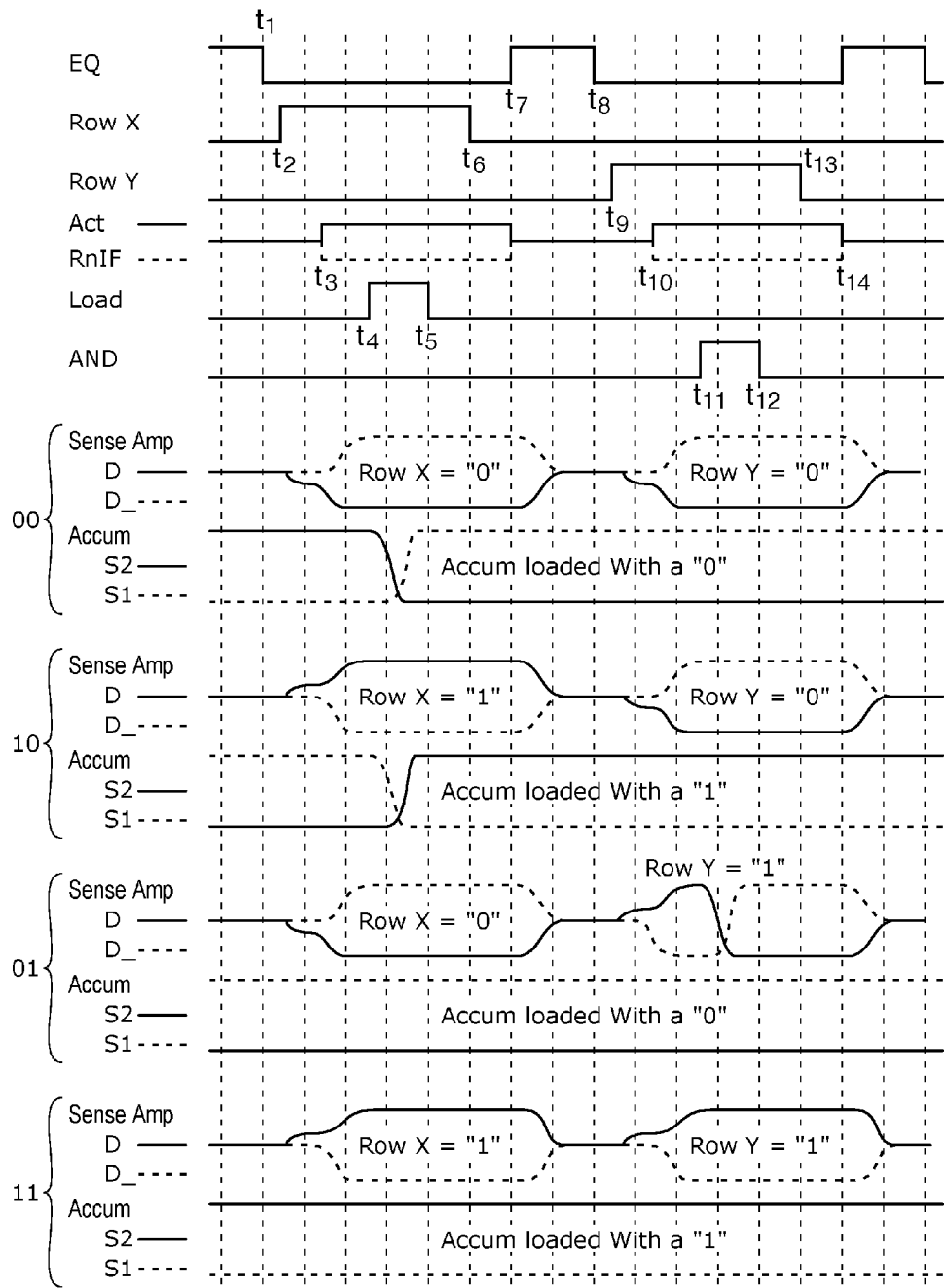
FIG. 5 illustrates a timing diagram associated with performing a logical operation and a shifting operation using the sensing circuitry in accordance with a number of embodiments of the present disclosure.

FIG. 5 illustrates a timing diagram associated with performing a number of logical operations using sensing circuitry in accordance with a number of embodiments of the present disclosure. FIG. 5 illustrates a timing diagram associated with initiating an AND logical operation after starting to load the second operand (e.g., Row Y data value) into the sense amplifier. FIG. 5 illustrates the sense amplifier and accumulator signals for various combinations of first and second operand data values. FIG. 5 shows the respective sense amplifier and accumulator signals corresponding to each combination of Row X data value and Row Y data value in each set. The particular timing diagram signals are discussed below with respect to the pseudo code associated with an AND operation of the circuit shown in FIG. 4.

An example of pseudo code associated with loading (e.g., copying) a first data value stored in a cell coupled to row 304-X into the accumulator can be summarized as follows:
  Copy Row X into the Accumulator:
  Deactivate EQ;
  Open Row X;
  Fire Sense Amps (after which Row X data resides in the sense amps);
  Activate LOAD (sense amplifier data (Row X) is transferred to nodes S1 and S2 of the Accumulator and resides there dynamically);
  Deactivate LOAD;
  Close Row X;
  Precharge;

In the pseudo code above, "Deactivate EQ" indicates that an equilibration signal (EQ signal shown in FIG. 5) corresponding to the sense amplifier 306 is disabled at $t_1$ as shown in FIG. 5 (e.g., such that the complementary data lines (e.g., 305-1 (D) and 305-2 (D_) are no longer shorted to $V_{DD}/2$).

After equilibration is deactivated, a selected row (e.g., ROW X) is enabled (e.g., selected, opened such as by activating a signal to select a particular row) as indicated by "Open Row X" in the pseudo code and shown at $t_2$ for signal Row X in FIG. 5. When the voltage signal applied to ROW X reaches the threshold voltage (Vt) of the access transistor (e.g., 302-2) corresponding to the selected cell, the access transistor turns on and couples the data line (e.g., 305-2 (D_)) to the selected cell (e.g., to capacitor 303-2) which creates a differential voltage signal between the data lines.

After Row X is opened, in the pseudo code above, "Fire Sense Amps" indicates that the sense amplifier 306 is enabled to set the primary latch and subsequently disabled. For example, as shown at $t_3$ in FIG. 5, the ACT positive control signal (e.g., 590 shown in FIG. 5) goes high and the RnIF negative control signal (e.g., 528 shown in FIG. 5) goes low, which amplifies the differential signal between 305-1 (D) and D_ 305-2, resulting in a voltage (e.g., $V_{DD}$) corresponding to a logic 1 or a voltage (e.g., GND) corresponding to a logic 0 being on data line 305-1 (D) (and the voltage corresponding to the other logic state being on complementary data line 305-2 (D_)). The sensed data value is stored in the primary latch of sense amplifier 306. The primary energy consumption occurs in charging the data lines (e.g., 305-1 (D) or 305-2 (D_)) from the equilibration voltage $V_{DD}/2$ to the rail voltage $V_{DD}$.

The four sets of possible Sense amplifier and Accumulator signals illustrated in FIG. 5 (e.g., one for each combination of Row X and Row Y data values) shows the behavior of signals on data lines D and D_. The Row X data value is stored in the primary latch of the sense amp. It should be noted that FIG. 3 shows that the memory cell including storage element 302-2, corresponding to Row X, is coupled to the complementary data line D_, while the memory cell including storage element 302-1, corresponding to Row Y, is coupled to data line D. However, as can be seen in FIG. 3, the charge stored in the memory cell associated with transistor 302-2 (corresponding to Row X) corresponding to a "0" data value causes the voltage on data line D_ (to which memory cell associated with transistor 302-2 is coupled) to go high and the charge stored in memory cell associated with transistor 302-2 corresponding to a "1" data value causes the voltage on data line D_ to go low, which is opposite correspondence between data states and charge stored in memory cell associated with transistor 302-2, corresponding to Row Y, that is coupled to data line D. These differences in storing charge in memory cells coupled to different data lines is appropriately accounted for when writing data values to the respective memory cells.

After firing the sense amps, in the pseudo code above, "Activate LOAD" indicates that the LOAD control signal goes high as shown at $t_4$ in FIG. 5, causing load transistors 318-1 and 318-2 to conduct. In this manner, activating the LOAD control signal enables the dynamic latch (e.g., secondary latch in the accumulator) of the compute component 331. The sensed data value stored in the sense amplifier 306 is transferred (e.g., copied) to the dynamic latch so as to be dynamically stored on nodes S1 and S2. As shown for each of the four sets of possible Sense amplifier and Accumulator signals illustrated in FIG. 5, the behavior at S1 and S2 of the dynamic latch of the Accumulator indicates the secondary latch is loaded with the Row X data value. As shown in FIG. 3, the dynamic latch of the Accumulator may flip (e.g., see Accumulator signals for Row X="0" and Row Y="0" and for Row X="1" and Row Y="0"), or not flip, see Accumulator signals for Row X="0" and Row Y="1" and for Row X="1" and Row Y="1"), depending on the data value previously stored in the dynamic latch.

After setting the dynamic latch from the data values stored in the sense amplifier (and present on the data lines 305-1 (D) and 305-2 (D_), in the pseudo code above, "Deactivate LOAD" indicates that the LOAD control signal goes back low as shown at $t_5$ in FIG. 5 to cause the load transistors 318-1 and 318-2 to stop conducting and thereby isolate the dynamic latch from the complementary data lines. However, the data value remains dynamically stored in dynamic latch of the accumulator at nodes S1 and S2.

After storing the data value on the dynamic latch, the selected row (e.g., ROW X) is disabled (e.g., deselected, closed such as by deactivating a select signal for a particular row) as indicated by "Close Row X" and indicated at $t_6$ in FIG. 5, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above and shown in FIG. 5 by the EQ signal going high at $t_7$. As shown in each of the four sets of possible Sense amplifier and Accumulator signals illustrated in FIG. 5 at $t_7$, the equilibrate operation causes the voltage on data lines D and D_ to each return to $V_{DD}/2$. Equilibration can occur, for instance, prior to a memory cell sensing operation or the logical operations (described below).

A subsequent operation phase associated with performing the AND or the OR operation on the first data value (now stored in the sense amplifier 206 and the dynamic latch of the accumulator 331-1) and the second data value (stored in a memory cell coupled to transistor 302-1 coupled to Row Y 304-Y) includes performing particular steps which depend on the whether an AND or an OR is to be performed. Examples of pseudo code associated with "ANDing" and "ORing" the data value residing in the accumulator (e.g., the first data value stored in the memory cell coupled to transistor 302-2 coupled to Row X 304-X) and the second data value (e.g., the data value stored in the memory cell coupled to transistor 302-1 coupled to Row Y 304-Y) are summarized below. Example pseudo code associated with "ANDing" the data values can include:

Deactivate EQ;
Open Row Y;
Fire Sense Amps (after which Row Y data resides in the sense amps);
Close Row Y;
The result of the logic operation, in the next operation, will be placed on the sense amp, which will overwrite any row that is open;
Even when Row Y is closed, the sense amplifier still contains the Row Y data value;
Activate AND;
This results in the sense amplifier being written to the value of the function (e.g., Row X AND Row Y);
If the accumulator contains a "0" (i.e., a voltage corresponding to a "0" on node S2 and a voltage corresponding to a "1" on node S1), the sense amplifier data is written to a "0";
If the accumulator contains a "1" (i.e., a voltage corresponding to a "1" on node S2 and a voltage corresponding to a "0" on node S1), the sense amplifier data remains unchanged (Row Y data);

This operation leaves the data in the accumulator unchanged;
Deactivate AND;
Precharge;

In the pseudo code above, "Deactivate EQ" indicates that an equilibration signal corresponding to the sense amplifier 306 is disabled (e.g., such that the complementary data lines 305-1 (D) and 305-2 (D_) are no longer shorted to $V_{DD}/2$), which is illustrated in FIG. 5 at $t_8$. After equilibration is deactivated, a selected row (e.g., ROW Y) is enabled as indicated in the pseudo code above by "Open Row Y" and shown in FIG. 5 at $t_9$. When the voltage signal applied to ROW Y reaches the threshold voltage (Vt) of the access transistor (e.g., 302-1) corresponding to the selected cell, the access transistor turns on and couples the data line (e.g., D_ 305-1) to the selected cell (e.g., to capacitor 303-1) which creates a differential voltage signal between the data lines.

After Row Y is opened, in the pseudo code above, "Fire Sense Amps" indicates that the sense amplifier 306 is enabled to amplify the differential signal between 305-1 (D) and 305-2 (D_), resulting in a voltage (e.g., $V_{DD}$) corresponding to a logic 1 or a voltage (e.g., GND) corresponding to a logic 0 being on data line 305-1 (D) (and the voltage corresponding to the other logic state being on complementary data line 305-2 (D_)). As shown at $t_{10}$ in FIG. 3, the ACT positive control signal (e.g., 290 shown in FIG. 2) goes high and the RnIF negative control signal (e.g., 228 shown in FIG. 2) goes low to fire the sense amps. The sensed data value from memory cell 302-1 is stored in the primary latch of sense amplifier 306, as previously described. The dynamic latch still corresponds to the data value from memory cell coupled to transistor 302-2 since the dynamic latch is unchanged.

After the second data value sensed from the memory cell coupled to transistor 302-1 coupled to Row Y is stored in the primary latch of sense amplifier 306, in the pseudo code above, "Close Row Y" indicates that the selected row (e.g., ROW Y) can be disabled if it is not desired to store the result of the AND logical operation back in the memory cell corresponding to Row Y. However, FIG. 5 shows that Row Y is left open such that the result of the logical operation can be stored back in the memory cell corresponding to Row Y. Isolating the memory cell corresponding to Row Y can be accomplished by the access transistor turning off to decouple the selected cell 302-1 from the data line 305-1 (D). After the selected Row Y is configured (e.g., to isolate the memory cell or not isolate the memory cell), "Activate AND" in the pseudo code above indicates that the AND control signal goes high as shown in FIG. 5 at $t_{11}$, causing pass transistor 307-1 to conduct. In this manner, activating the AND control signal causes the value of the function (e.g., Row X AND Row Y) to be written to the sense amp.

With the first data value (e.g., Row X) stored in the dynamic latch of the accumulator 331-1 and the second data value (e.g., Row Y) stored in the sense amplifier 306, if the dynamic latch of the accumulator 331-1 contains a "0" (i.e., a voltage corresponding to a "0" on node S2 and a voltage corresponding to a "1" on node S1), the sense amplifier data is written to a "0" (regardless of the data value previously stored in the sense amp) since the voltage corresponding to a "1" on node S1 causes transistor 309-1 to conduct thereby coupling the sense amplifier 206 to ground through transistor 309-1, pass transistor 307-1 and data line 305-1 (D). When either data value of an AND operation is "0," the result is a "0." Here, when the second data value (in the dynamic latch) is a "0," the result of the AND operation is a "0" regardless of the state of the first data value, and so the configuration of the sensing circuitry causes the "0" result to be written and initially stored in the sense amplifier 306. This operation leaves the data value in the accumulator unchanged (e.g., from Row X).

If the dynamic latch of the accumulator contains a "1" (e.g., from Row X), then the result of the AND operation depends on the data value stored in the sense amplifier 306 (e.g., from Row Y). The result of the AND operation should be a "1" if the data value stored in the sense amplifier 206 (e.g., from Row Y) is also a "1," but the result of the AND operation should be a "0" if the data value stored in the sense amplifier 306 (e.g., from Row Y) is also a "0." The sensing circuitry 331-1 is configured such that if the dynamic latch of the accumulator contains a "1" (i.e., a voltage corresponding to a "1" on node S2 and a voltage corresponding to a "0" on node S1), transistor 309-1 does not conduct, the sense amplifier is not coupled to ground (as described above), and the data value previously stored in the sense amplifier 306 remains unchanged (e.g., Row Y data value so the AND operation result is a "1" if the Row Y data value is a "1" and the AND operation result is a "0" if the Row Y data value is a "0"). This operation leaves the data value in the accumulator unchanged (e.g., from Row X).

After the result of the AND operation is initially stored in the sense amplifier 306, "Deactivate AND" in the pseudo code above indicates that the AND control signal goes low as shown at $t_{12}$ in FIG. 5, causing pass transistor 307-1 to stop conducting to isolate the sense amplifier 306 (and data line 305-1 (D)) from ground. If not previously done, Row Y can be closed (as shown at $t_{13}$ in FIG. 3) and the sense amplifier can be disabled (as shown at $t_{14}$ in FIG. 5 by the ACT positive control signal going low and the RnIF negative control signal goes high). With the data lines isolated, "Precharge" in the pseudo code above can cause a precharge of the data lines by an equilibrate operation, as described previously (e.g., commencing at $t_{14}$ shown in FIG. 5).

FIG. 5 shows, in the alternative, the behavior of voltage signals on the data lines (e.g., 305-1 (D) and 305-2 (D_) shown in FIG. 3) coupled to the sense amplifier (e.g., 306 shown in FIG. 3) and the behavior of voltage signals on nodes S1 and S1 of the dynamic latch of the compute component (e.g., 331-1 shown in FIG. 3) for an AND logical operation involving each of the possible combination of operands (e.g., Row X/Row Y data values 00, 10, 01, and 11).

Although the timing diagrams illustrated in FIG. 5 and the pseudo code described above indicate initiating the AND logical operation after starting to load the second operand (e.g., Row Y data value) into the sense amplifier, the circuit shown in FIG. 3 can be successfully operated by initiating the AND logical operation before starting to load the second operand (e.g., Row Y data value) into the sense amplifier.

Figure 6:
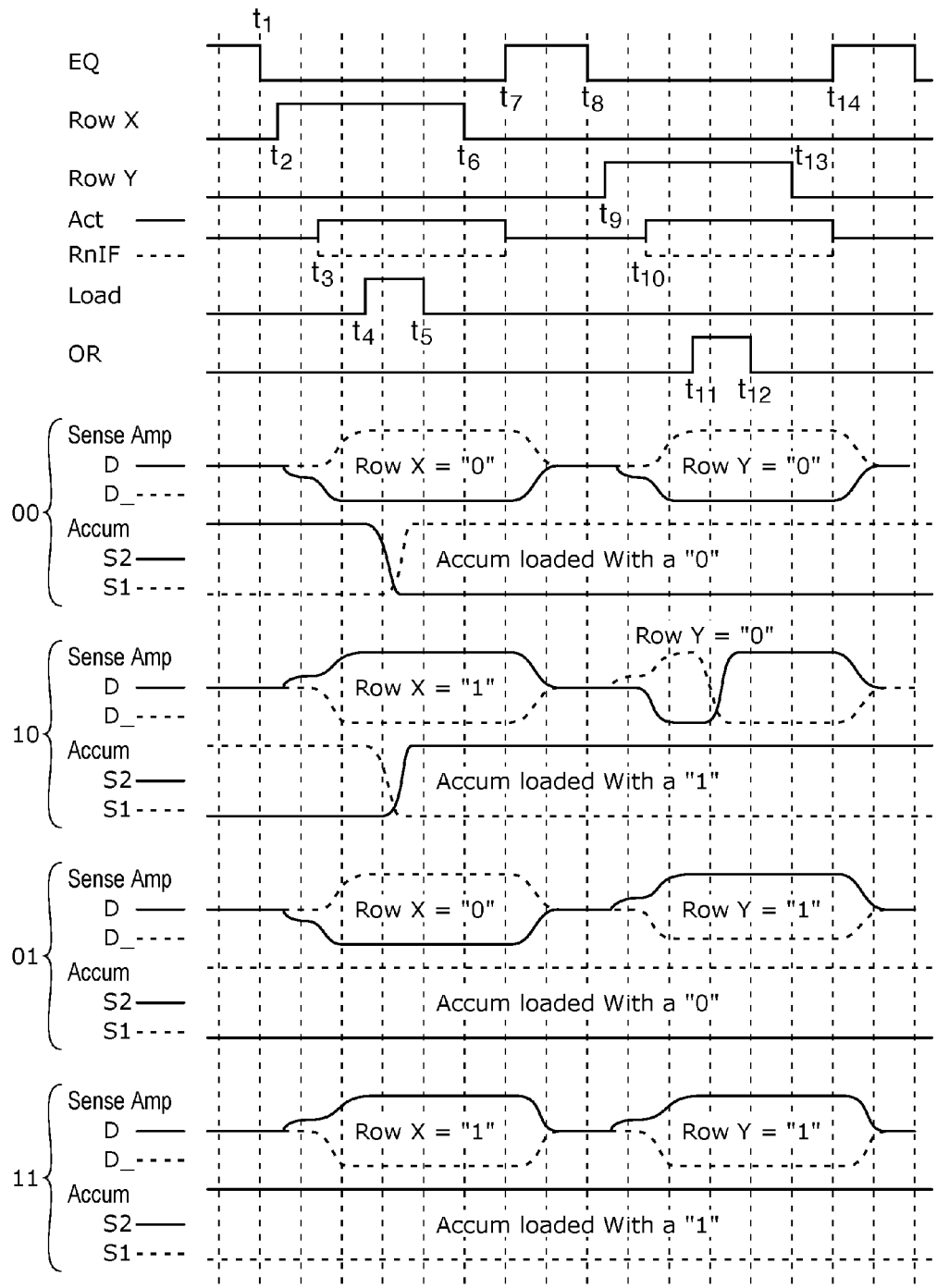
FIG. 6 illustrates a timing diagram associated with performing a logical operation and a shifting operation using the sensing circuitry in accordance with a number of embodiments of the present disclosure.

FIG. 6 illustrates a timing diagram associated with performing a number of logical operations using sensing circuitry in accordance with a number of embodiments of the present disclosure. FIG. 6 illustrates a timing diagram associated with initiating an OR logical operation after starting to load the second operand (e.g., Row Y data value) into the sense amplifier. FIG. 6 illustrates the sense amplifier and accumulator signals for various combinations of first and second operand data values. The particular timing diagram signals are discussed below with respect to the pseudo code associated with an AND logical operation of the circuit shown in FIG. 3.

A subsequent operation phase can alternately be associated with performing the OR operation on the first data value (now stored in the sense amplifier 306 and the dynamic latch of the accumulator 331-1) and the second data value (stored in a memory cell 302-1 coupled to Row Y 304-Y). The operations to load the Row X data into the sense amplifier and accumulator that were previously described with respect to times $t_1$-$t_7$ shown in FIG. 3 are not repeated with respect to FIG. 6. Example pseudo code associated with "ORing" the data values can include:

Deactivate EQ;
Open Row Y;
Fire Sense Amps (after which Row Y data resides in the sense amps);
Close Row Y;
When Row Y is closed, the sense amplifier still contains the Row Y data value;
Activate OR;
This results in the sense amplifier being written to the value of the function (e.g., Row X OR Row Y), which may overwrite the data value from Row Y previously stored in the sense amplifier as follows:
If the accumulator contains a "0" (i.e., a voltage corresponding to a "0" on node S2 and a voltage corresponding to a "1" on node S1), the sense amplifier data remains unchanged (Row Y data);
If the accumulator contains a "1" (i.e., a voltage corresponding to a "1" on node S2 and a voltage corresponding to a "0" on node S1), the sense amplifier data is written to a "1";
This operation leaves the data in the accumulator unchanged;
Deactivate OR;
Precharge;

The "Deactivate EQ" (shown at $t_8$ in FIG. 6), "Open Row Y" (shown at $t_9$ in FIG. 6), "Fire Sense Amps" (shown at $t_{10}$ in FIG. 4), and "Close Row Y" (shown at $t_{13}$ in FIG. 6, and which may occur prior to initiating the particular logical function control signal), shown in the pseudo code above indicate the same functionality as previously described with respect to the AND operation pseudo code. Once the configuration of selected Row Y is appropriately configured (e.g., opened if logical operation result is to be stored in memory cell corresponding to Row Y or closed to isolate memory cell if result if logical operation result is not to be stored in memory cell corresponding to Row Y), "Activate OR" in the pseudo code above indicates that the OR control signal goes high as shown at $t_{11}$ in FIG. 6, which causes pass transistor 307-2 to conduct. In this manner, activating the OR control signal causes the value of the function (e.g., Row X OR Row Y) to be written to the sense amp.

With the first data value (e.g., Row X) stored in the dynamic latch of the accumulator 331-1 and the second data value (e.g., Row Y) stored in the sense amplifier 306, if the dynamic latch of the accumulator contains a "0" (i.e., a voltage corresponding to a "0" on node S2 and a voltage corresponding to a "1" on node S1), then the result of the OR operation depends on the data value stored in the sense amplifier 306 (e.g., from Row Y). The result of the OR operation should be a "1" if the data value stored in the sense amplifier 306 (e.g., from Row Y) is a "1," but the result of the OR operation should be a "0" if the data value stored in the sense amplifier 306 (e.g., from Row Y) is also a "0." The sensing circuitry 331-1 is configured such that if the dynamic latch of the accumulator contains a "0," with the voltage corresponding to a "0" on node S2, transistor 309-2 is off and does not conduct (and pass transistor 207-1 is also off since the AND control signal is not asserted) so the sense amplifier 306 is not coupled to ground (either side), and the data value previously stored in the sense amplifier 306 remains unchanged (e.g., Row Y data value such that the OR operation result is a "1" if the Row Y data value is a "1" and the OR operation result is a "0" if the Row Y data value is a "0").

If the dynamic latch of the accumulator contains a "1" (i.e., a voltage corresponding to a "1" on node S2 and a voltage corresponding to a "0" on node S1), transistor 309-2 does conduct (as does pass transistor 307-2 since the OR control signal is asserted), and the sense amplifier 306 input coupled to data line 305-2 (D_) is coupled to ground since the voltage corresponding to a "1" on node S2 causes transistor 309-2 to conduct along with pass transistor 307-2 (which also conducts since the OR control signal is asserted). In this manner, a "1" is initially stored in the sense amplifier 306 as a result of the OR operation when the dynamic latch of the accumulator contains a "1" regardless of the data value previously stored in the sense amp. This operation leaves the data in the accumulator unchanged. FIG. 6 shows, in the alternative, the behavior of voltage signals on the data lines (e.g., 305-1 (D) and 305-2 (D_) shown in FIG. 3) coupled to the sense amplifier (e.g., 306 shown in FIG. 3) and the behavior of voltage signals on nodes S1 and S2 of the dynamic latch of the compute component (e.g., 331-1 shown in FIG. 3) for an OR logical operation involving each of the possible combination of operands (e.g., Row X/Row Y data values 00, 10, 01, and 11).

After the result of the OR operation is initially stored in the sense amplifier 306, "Deactivate OR" in the pseudo code above indicates that the OR control signal goes low as shown at $t_{12}$ in FIG. 6, causing pass transistor 307-2 to stop conducting to isolate the sense amplifier 306 (and data line D 305-2) from ground. If not previously done, Row Y can be closed (as shown at $t_{13}$ in FIG. 4) and the sense amplifier can be disabled (as shown at $t_{14}$ in FIG. 6 by the ACT positive control signal going low and the RnIF negative control signal going high). With the data lines isolated, "Precharge" in the pseudo code above can cause a precharge of the data lines by an equilibrate operation, as described previously and shown at $t_{14}$ in FIG. 6.

When performing logical operations in this manner, the sense amplifier 306-2 can be pre-seeded with a data value from the dynamic latch of the accumulator to reduce overall current utilized because the sense amps 306-2 are not at full rail voltages (e.g., supply voltage or ground/reference voltage) when accumulator function is copied to the sense amplifier 306-2. An operation sequence with a pre-seeded sense amplifier 306-2 either forces one of the data lines to the reference voltage (leaving the complementary data line at $V_{DD}/2$, or leaves the complementary data lines unchanged. The sense amplifier 306-2 pulls the respective data lines to full rails when the sense amplifier 306-2 fires. Using this sequence of operations will overwrite data in an open Row.

A SHIFT operation can be accomplished by multiplexing ("muxing") two neighboring data line complementary pairs using a traditional DRAM isolation (ISO) scheme. According to embodiments of the present disclosure, the shift circuitry 323 can be used for shifting data values stored in memory cells coupled to a particular pair of complementary data lines to the sensing circuitry 350 (e.g., sense amplifier 306-2) corresponding to a different pair of complementary data lines (e.g., such as a sense amplifier 306-2 corresponding to a left or right adjacent pair of complementary data lines. As used herein, a sense amplifier 306-2 corresponds to the pair of complementary data lines to which the sense amplifier is coupled when isolation transistors 321-1 and 321-2 are conducting. The SHIFT operations (right or left) do not pre-copy the Row X data value into the accumulator. Operations to shift right Row X can be summarized as follows:

Deactivate Norm and Activate Shift;
Deactivate EQ;
Open Row X;
Fire Sense Amps (after which shifted Row X data resides in the sense amps);
Activate Norm and Deactivate Shift;
Close Row X;
Precharge;

In the pseudo code above, "Deactivate Norm and Activate Shift" indicates that a NORM control signal goes low causing isolation transistors 321-1 and 321-2 of the shift circuitry 323 to not conduct (e.g., isolate the sense amplifier from the corresponding pair of complementary data lines). The SHIFT control signal goes high causing isolation transistors 321-3 and 321-4 to conduct, thereby coupling the sense amplifier 306-2 to the left adjacent pair of complementary data lines (e.g., on the memory array side of non-conducting isolation transistors 321-1 and 321-2 for the left adjacent pair of complementary data lines).

After the shift circuitry 323 is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the left adjacent pair of complementary data lines is shifted right and stored in the sense amplifier 306-2.

In the pseudo code above, "Activate Norm and Deactivate Shift" indicates that a NORM control signal goes high causing isolation transistors 321-1 and 321-2 of the shift circuitry 323 to conduct (e.g., coupling the sense amplifier to the corresponding pair of complementary data lines), and the SHIFT control signal goes low causing isolation transistors 321-3 and 321-4 to not conduct and isolating the sense amplifier 306-2 from the left adjacent pair of complementary data lines (e.g., on the memory array side of non-conducting isolation transistors 321-1 and 321-2 for the left adjacent pair of complementary data lines). Since Row X is still open, the Row X data value that has been shifted right is transferred to Row X of the corresponding pair of complementary data lines through isolation transistors 321-1 and 321-2.

After the Row X data values are shifted right to the corresponding pair of complementary data lines, the selected row (e.g., ROW X) is disabled as indicated by "Close Row X" in the pseudo code above, which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

Operations to shift left Row X can be summarized as follows:

Activate Norm and Deactivate Shift;
Deactivate EQ;
Open Row X;
Fire Sense Amps (after which Row X data resides in the sense amps);
Deactivate Norm and Activate Shift;
Sense amplifier data (shifted left Row X) is transferred to Row X;
Close Row X;
Precharge;

In the pseudo code above, "Activate Norm and Deactivate Shift" indicates that a NORM control signal goes high causing isolation transistors 321-1 and 321-2 of the shift circuitry 323 to conduct, and the SHIFT control signal goes low causing isolation transistors 321-3 and 321-4 to not conduct. This configuration couples the sense amplifier 306-2 to a corresponding pair of complementary data lines and isolates the sense amplifier from the right adjacent pair of complementary data lines.

After the shift circuitry is configured, the "Deactivate EQ," "Open Row X," and "Fire Sense Amps" shown in the pseudo code above indicate the same functionality as the same operations in the pseudo code for the "Copy Row X into the Accumulator" initial operation phase described above prior to pseudo code for the AND operation and OR operation. After these operations, the Row X data value for the memory cell coupled to the pair of complementary data lines corresponding to the sense circuitry 350 is stored in the sense amplifier 306-2.

In the pseudo code above, "Deactivate Norm and Activate Shift" indicates that a NORM control signal goes low causing isolation transistors 321-1 and 321-2 of the shift circuitry 323 to not conduct (e.g., isolate the sense amplifier from the corresponding pair of complementary data lines), and the SHIFT control signal goes high causing isolation transistors 321-3 and 321-4 to conduct coupling the sense amplifier to the left adjacent pair of complementary data lines (e.g., on the memory array side of non-conducting isolation transistors 321-1 and 321-2 for the left adjacent pair of complementary data lines. Since Row X is still open, the Row X data value that has been shifted left is transferred to Row X of the left adjacent pair of complementary data lines.

After the Row X data values are shifted left to the left adjacent pair of complementary data lines, the selected row (e.g., ROW X) is disabled as indicated by "Close Row X," which can be accomplished by the access transistor turning off to decouple the selected cell from the corresponding data line. Once the selected row is closed and the memory cell is isolated from the data lines, the data lines can be precharged as indicated by the "Precharge" in the pseudo code above. A precharge of the data lines can be accomplished by an equilibrate operation, as described above.

According to various embodiments, general computing can be enabled in a memory array core of a processor-in-memory (PIM) device such as a DRAM one transistor per memory cell (e.g., 1T1C) configuration at $6F^2$ or $4F^2$ memory cell sizes, for example. The advantage of the apparatuses and methods described herein is not realized in terms of single instruction speed, but rather the cumulative speed that can be achieved by an entire bank of data being computed in parallel without ever transferring data out of the memory array (e.g., DRAM) or firing a column decode. In other words, data transfer time can be eliminated. For example, apparatus of the present disclosure can perform ANDs or ORs simultaneously using data values in memory cells coupled to a data line (e.g., a column of 16K memory cells).

In previous approach sensing circuits where data is moved out for logical operation processing (e.g., using 32 or 64 bit registers), fewer operations can be performed in parallel compared to the apparatus of the present disclosure. In this manner, significantly higher throughput is effectively provided in contrast to conventional configurations involving a central processing unit (CPU) discrete from the memory such that data must be transferred therebetween. An apparatus and/or methods according to the present disclosure can also use less energy/area than configurations where the CPU is discrete from the memory. Furthermore, an apparatus and/or methods of the present disclosure can improve upon the smaller energy/area advantages since the in-memory-array logical operations save energy by eliminating certain data value transfers.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a first sensing component, comprising:
      a first sense amplifier coupled to a first pair of complementary sense lines; and
      a first compute component comprising a number of first pass transistors; and
   a second sensing component, comprising:
      a second sense amplifier coupled to a second pair of complementary sense lines; and
      a second compute component comprising a number of second pass transistors;
   wherein the first pair of complementary sense lines are each directly coupled to a respective one of the number of first pass transistors and directly coupled to a respective one of the number of second pass transistors.

2. The apparatus of claim 1, wherein the number of first pass transistors are complement pass transistors comprising pass transistors associated with a complement value and the number of second pass transistors are true pass transistors comprising pass transistors associated with a true value.

3. The apparatus of claim 1, wherein the first pair of complementary sense lines is adjacent to the second pair of complementary sense lines.

4. The apparatus of claim 1, wherein the first compute component comprises a number of true pass transistors comprising pass transistors associated with a true value.

5. The apparatus of claim 1, wherein:
   the second compute component comprises a number of third pass transistors; and
   the second pair of complementary sense lines are each directly coupled to a respective one of the number of third pass transistors.

6. The apparatus of claim 5, wherein:
   the first sensing component is configured to transfer a value associated with the first sensing component from the first sense amplifier to the number of second pass transistors; and
   the second sensing component is configured to transfer a value associated with the second sensing component from the second sense amplifier to the number of third pass transistors.

7. The apparatus of claim 6, wherein the first sensing component and the second sensing component are configured to swap values between the first and the second sensing components.

8. The apparatus of claim 7, further comprising a third sensing component comprising:
   a third sense amplifier coupled to a third pair of complementary sense lines; and
   a third compute component comprising a number of fourth pass transistors;
   wherein the the third pair of complementary sense lines are each directly coupled to a respective one of the number of fourth pass transistors.

9. The apparatus of claim 8, wherein the third sensing component is adjacent to the first sensing component opposite the second sensing component.

10. The apparatus of claim 9, wherein the number of third pass transistors comprise a number of complement pass transistors comprising pass transistors associated with a complement value.

11. The apparatus of claim 10, wherein the second pair of complementary sense lines are directly coupled to the number of complement pass transistors.

12. The apparatus of claim 7, wherein the first sensing component is configured to transfer a complement value from the first sense amplifier through the number of first pass transistors to be stored in the first compute component.

13. The apparatus of claim 12, wherein the first sensing component is configured to transfer the complement value from the first compute component to the first sense amplifier.

14. A method, comprising:
   transferring a first value from a first sense amplifier coupled to a first pair of complementary sense lines to a compute component directly coupled to the first pair of complementary sense lines and directly coupled to a second pair of complementary sense lines,
   transferring a second value from a second sense amplifier coupled to the second pair of complimentary sense lines to the compute component; and
   performing an operation on the first value and the second value using the compute component.

15. The method of claim 14, wherein the first value is a true value associated with the first sense amplifier.

16. The method of claim 15, wherein the second value is a complement value associated with the second sense amplifier.

17. The method of claim 14, wherein performing the operation comprises performing at least one of an AND operation and an OR operation.

18. An apparatus, comprising:
a first sensing component comprising:
  a first sense amplifier coupled to a first pair of complementary sense lines; and
a second sensing component comprising:
  a second sense amplifier coupled to a second pair of complementary sense lines; and
  a compute component directly coupled to the first pair of complementary sense line and to the second pair of complementary sense lines; and
wherein the compute component is configured to perform an operation on a true value of the first sensing component and a complement value of the second sensing component.

19. The apparatus of claim 18, wherein the compute component comprises a pair of true pass transistors comprising pass transistors associated with the true value and a pair of complement pass transistors comprising pass transistors associated with the complement value.

20. The apparatus of claim 18, wherein the compute component comprises:
a pair of true pass transistors, comprising pass transistors associated with the true value, directly coupled to the first pair of complementary sense lines; and
a pair of complement pass transistors, comprising pass transistors associated with the complement value, directly coupled to the second pair of complementary sense lines.

21. The apparatus of claim 20, wherein the true value associated with the first sensing component passes through the pair of true pass transistors to transfer the true value from being stored in the first sense amplifier to being stored in the compute component.

22. The apparatus of claim 20, wherein the complement value associated with the second sensing component passes through the pair of complement pass transistors to transfer the complement value from being stored in the second sense amplifier to being stored in the compute component.

23. An apparatus comprising:
a first pair of complementary sense lines coupled to a first sense amplifier and to a first compute component, wherein the first compute component comprises a first pair of true pass transistors comprising pass transistors associated with a particular true value and a first pair of complement pass transistors comprising pass transistors associated with a first complement value;
a second pair of complementary sense lines coupled to a second sense amplifier and to a second compute component, wherein the second compute component comprises a second pair of true pass transistors comprising pass transistors associated with a first true value and a second pair of complement pass transistors comprising pass transistors associated with a second complement value; and
a controller configured to cause:
  the first complement value stored in the first sense amplifier to be transferred through the first pair of complement pass transistors to the first compute component;
  the first true value stored in the first sense amplifier to be transferred through the second pair of true pass transistors to the second compute component; and
  the second complement value stored in the second sense amplifier to be transferred through the second pair of complement pass transistors to the second compute component.

24. The apparatus of claim 23, comprising:
a third pair of complementary sense lines coupled to a third sense amplifier and to a third compute component, wherein the third compute component comprises a third pair of true pass transistors comprising pass transistors associated with the second true value and a third pair of complement pass transistors comprising pass transistors associated with a third complement value.

25. The apparatus of claim 24, wherein the controller is configured to cause the second true value stored in the second sense amplifier to be transferred through the third pair of true pass transistors to the third compute component.

26. The apparatus of claim 24, wherein the controller is configured to cause the third complement value stored in the third sense amplifier to be transferred through the third pair of complement pass transistor to the third compute component.

* * * * *